(12) United States Patent
Doshida et al.

(10) Patent No.: US 8,395,106 B2
(45) Date of Patent: Mar. 12, 2013

(54) OPTICAL SEMICONDUCTOR DEVICE WITH QUANTUM DOTS HAVING CONFIGURATIONAL ANISOTROPY

(75) Inventors: Minoru Doshida, Yokohama (JP); Mitsuhiro Nagashima, Suginama (JP); Michiya Kibe, Sagamihara (JP); Hiroyasu Yamashita, Kawasaki (JP); Hironori Nishino, Kawasaki (JP); Yusuke Matsukura, Kawasaki (JP); Yasuhito Uchiyama, Kawasaki (JP)

(73) Assignees: Technical Research & Development Institute Ministry of Defense of Japan, Tokyo (JP); Fujitsu Limited, Kanagawa (JP)

( * ) Notice: Subject to any disclaimer, the term of this patent is extended or adjusted under 35 U.S.C. 154(b) by 721 days.

(21) Appl. No.: 12/535,263

(22) Filed: Aug. 4, 2009

(65) Prior Publication Data
US 2010/0032552 A1 Feb. 11, 2010

(30) Foreign Application Priority Data
Aug. 8, 2008 (JP) ................................. 2008-205293

(51) Int. Cl.
*G02F 1/01* (2006.01)
(52) U.S. Cl. ....... 250/225; 250/214.1; 257/21; 257/428; 372/43.01; 372/44.011; 372/45.01; 372/45.013; 977/759; 977/774
(58) Field of Classification Search .................. 250/214, 250/225, 214.1; 257/21, 428; 372/43.01, 372/44.011, 45.01, 45.013; 977/759, 774
See application file for complete search history.

(56) References Cited

U.S. PATENT DOCUMENTS

| 5,331,654 | A  | * | 7/1994 | Jewell et al. | 372/45.01 |
|---|---|---|---|---|---|
| 6,963,402 | B2 | * | 11/2005 | Chism, II | 356/369 |
| 2002/0092987 | A1 | * | 7/2002 | Cho et al. | 250/338.4 |
| 2003/0052317 | A1 | * | 3/2003 | Ohshima | 257/14 |
| 2004/0124409 | A1 | * | 7/2004 | Ebe et al. | 257/14 |
| 2006/0039068 | A1 |  | 2/2006 | Tokita et al. |  |
| 2008/0230764 | A1 | * | 9/2008 | Burt | 257/12 |
| 2008/0318355 | A1 | * | 12/2008 | Amano | 438/47 |
| 2010/0255747 | A1 | * | 10/2010 | Yang et al. | 445/58 |
| 2010/0289061 | A1 | * | 11/2010 | Matsukura | 257/189 |

FOREIGN PATENT DOCUMENTS

| JP | 10-326906 A | 12/1998 |
|---|---|---|
| JP | 2000-299496 A | 10/2000 |
| JP | 2002-503877 A | 2/2002 |
| JP | 2006-058588 A | 3/2006 |

(Continued)

OTHER PUBLICATIONS

M. Sundaram et al,; "Two-color quantum well infrared photodetector focal plane arrays", Infrared Physics & Technology 2001, vol. 42, pp. 301-308.

(Continued)

*Primary Examiner* — Georgia Y Epps
*Assistant Examiner* — Kevin Wyatt
(74) *Attorney, Agent, or Firm* — Westerman, Hattori, Daniels & Adrian, LLP

(57) ABSTRACT

An optical semiconductor device includes a lower electrode layer formed over a semiconductor substrate, an infrared absorption layer formed over the lower electrode layer 26, and an upper electrode layer 38 formed over the infrared absorption layer 36. The infrared absorption layer includes a quantum dot having dimensions different among directions stacked, and is sensitive to infrared radiation of wavelengths different corresponding to polarization directions.

16 Claims, 19 Drawing Sheets

FOREIGN PATENT DOCUMENTS

JP 2007-42511 A 2/2007
WO 99/19912 A1 4/1999

OTHER PUBLICATIONS

J. J. Sakurai, San Fu Tuan, edited, Akio Sakurai translated, "Modern Quantum Mechanics (last volume)", Yoshioka Bookstore, May 1989, pp. 458-459.

T. Sugaya et al., "Improved optical properties of InAs quantum dots grown with an As2 source using molecular beam epitaxy", Journal of Appl. Phys. 2006, vol. 100, 063107.

Japanese Office Action dated Feb. 16, 2010, issued in corresponding Japanese Patent Application No. 2008-205293.

Sugaya, Takeyoshi et al.; "Improved Optical Properties of InAs Quantum Dots Grown with an As2 Source Using Molecular Beam Epitaxy"; Journal of Applied Physics, vol. 100, No. 6, pp. 063107-1-063107-4.

Furukawa et al.; "Dependence of Structural and optical properties of InAs/GaAs quantum dots on growth methods"; Extended Abstracts (The 46th Spring Meeting, 1999); The Japan Society of Applied Physics and Related Societies, No. 3, p. 1455, 29p-ZL-7.

Japanese Office Action dated Oct. 6, 2009, issued in corresponding Japanese Patent Application No. 2008-205293.

* cited by examiner

INCIDENT LIGHT

← → DIRECTION OF ELECTRIC FIELD OF INCIDENT LIGHT

CONDUCTION BAND EDGE
$E_3$
$E_2$
$E_1$
GROUND LEVEL

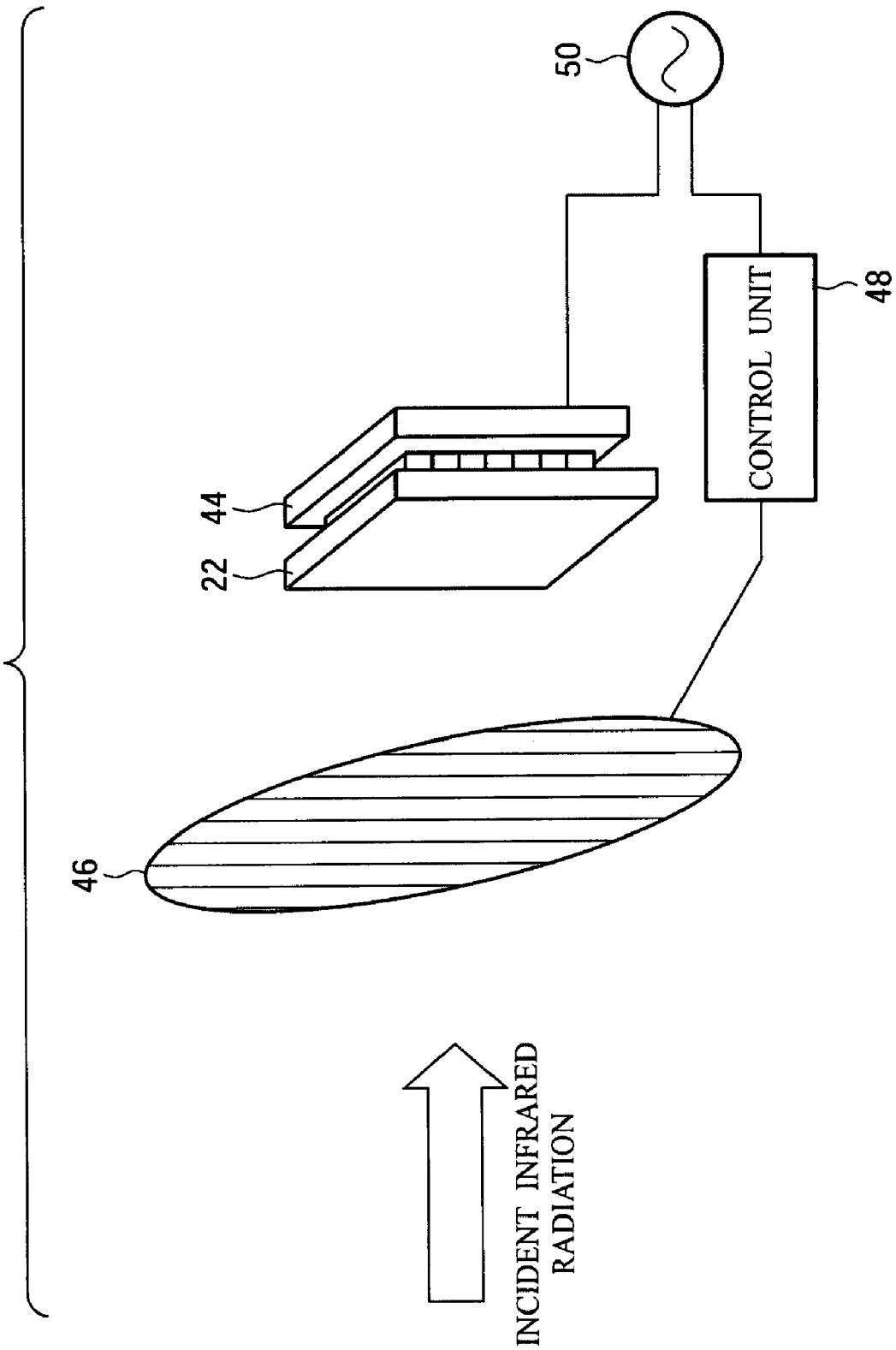

OPTICAL SEMICONDUCTOR DEVICE WITH QUANTUM DOTS HAVING CONFIGURATIONAL ANISOTROPY

CROSS REFERENCE TO RELATED APPLICATIONS

This application is based upon and claims the benefit of priority of the prior Japanese Patent Application No. 2008-205293, filed on Aug. 8, 2008, the entire contents of which are incorporated herein by reference.

FIELD

The embodiments discussed herein are related to an optical semiconductor device which detects or emits a multiwavelength infrared radiation.

BACKGROUND

The single wavelength optical detector, which detects infrared radiation of a certain wavelength, can measure the intensity of the infrared radiation of only one sensible wavelength out of the infrared radiation having a wide spectrum emitted from an object.

Accordingly, the single wavelength infrared photodetector cannot identify the temperature of an object and the distance from the infrared photodetector to the object. That is, when the infrared intensity of the sensible wavelength, which has been measured by the single wavelength infrared photodetector has a certain value, it is impossible to judge whether such infrared intensity is given because the object-to-be-detected, i.e., the infrared radiation source, is remote but has a high temperature, or such infrared intensity is given because the object-to-be-detected has a low temperature but locates near.

To judge a temperature of an object and a distance to the object, based on the infrared radiation emitted by the object, the multiwavelength infrared photodetector, which measures infrared radiation intensities of a plurality of wavelengths is used. The multiwavelength infrared photodetector can judge, based on infrared radiation intensities of the respective wavelengths having respective sensitivities, whether the temperature of an object-to-be-detected is high or low and whether the object locates remote or near.

As such multiwavelength infrared photodetector is proposed a photodetector including a plurality of infrared absorption layers of sensitivities to different wavelengths, which are stacked on a substrate (refer to, e.g., Japanese National Publication of International Patent Application No. 2002-503877, and Mani Sundaram et al., "Two-color quantum well infrared photodetector focal plane arrays", Infrared Physics & Technology, Volume 42, pp. 301-308 (2001)).

The structure of the proposed multiwavelength infrared photodetector will be explained with reference to FIG. 19. FIG. 19 is a sectional view illustrating the structure of a double wavelength infrared photodetector which is one example of the proposed multiwavelength infrared photodetector.

As illustrated, a first electrode layer 102 is formed on a substrate 100. On the first electrode layer 102, a first infrared absorption layer 104 which is sensitive to the infrared radiation of a prescribed wavelength is formed. On the first infrared absorption layer 104, a second electrode layer 106 is formed. On the second electrode layer 106, a second infrared absorption layer 108 whose sensitivity is different from the sensitivity of the first infrared absorption layer 104 is formed. On the second infrared absorption layer 108, a third electrode layer 110 is formed.

In the region of a part of the first electrode layer 102, the third electrode layer 110, the second infrared absorption layer 108, the second electrode layer 106 and the first infrared absorption layer 104 are removed, and on the first electrode layer 102 in this region, an electrode 112 is formed. The electrode 112 is for reading photocurrent or photovoltaic power generated by absorption of radiation in the first infrared absorption layer 104.

In the region of a part of the second electrode layer 106, the third electrode layer 110 and the second infrared absorption layer 108 are removed. On the second electrode layer 106 in this region, a common electrode 114 is formed.

On the third electrode layer 110, an electrode 116 is formed. The electrode 116 is for reading photocurrent or photovoltaic power generated by absorption of radiation in the second infrared absorption layer 108.

Thus, the double wavelength infrared photodetector including the first infrared absorption layer 104 and the second infrared absorption layer 108 is constituted.

The following is another example of related art of the present invention: Japanese Laid-open Patent Publication No. 2006-058588.

By the ordinary semiconductor device manufacturing method it is difficult to discretely form substrate plane-wise a plurality of infrared absorption layers having sensitivities to different wavelengths of infrared radiation. As described above, a plurality of infrared absorption layers are stacked vertically to the substrate.

On the other hand, the electrodes for reading electric signals of absorption of infrared radiation must be formed for the respective plural infrared absorption layers. In the multiwavelength infrared photodetector as illustrated in FIG. 19, for each infrared absorption layer, it is necessary to etch off the semiconductor layers containing the electrode layer connected to the infrared absorption layer formed over the infrared absorption layer to form the electrode on the exposed electrode layer.

In such multiwavelength infrared photodetector, the electrodes must be thus formed for the respective plural infrared absorption layers, which causes demerits that the electrode forming steps are complicated, the downsizing is limited, the read circuit for reading the electric signals is complicated and large-scaled, and other demerits.

SUMMARY

According to one aspect of an embodiment, there is provided an optical semiconductor device comprising: an active part which includes a quantum dot whose dimensions different among directions, to which incident light is applied, and which generates an electric signal by photoelectrically converting a light having a wavelength different corresponding to a polarization direction of the incident light.

According to another aspect of an embodiment, there is provided an optical semiconductor device comprising: an active unit which includes a quantum dot whose dimensions different among directions, to which an electric signal is inputted, and which emit a light of multiwavelength having wavelengths different corresponding to polarization directions by photoelectrically converting the electric signal.

The object and advantages of the embodiment will be realized and attained by means of the elements and combinations particularly pointed out in the claims.

BRIEF DESCRIPTION OF DRAWINGS

FIG. 5 is a diagrammatic view illustrating the general constitution of the optical semiconductor device according to the second embodiment;

DESCRIPTION OF EMBODIMENTS

First Embodiment

Figure 19:
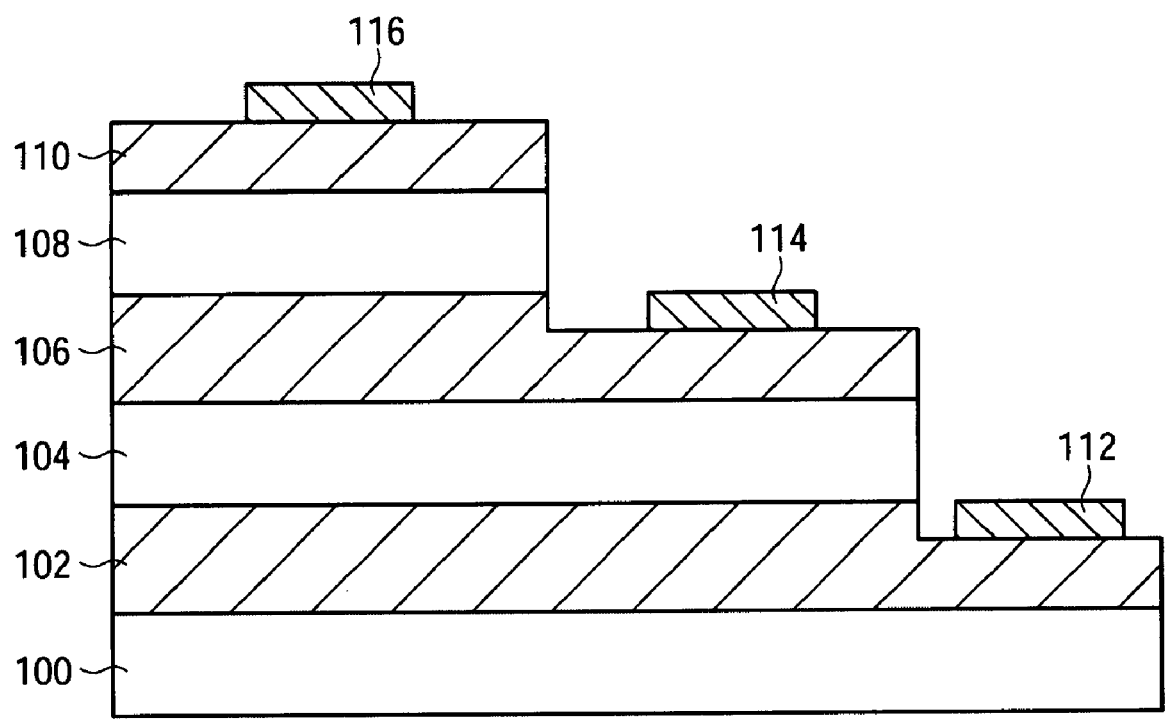
FIG. 19 is a sectional view illustrating the structure of the proposed multiwavelength infrared photodetector.

As described above, in the multiwavelength infrared photodetector as illustrated in FIG. 19, for each of the plural infrared absorption layers, the semiconductor layers containing the infrared absorption layer is etched off to thereby form the electrodes. This makes the electrode forming steps complicated. The removal of the infrared absorption layers reduces the detection of infrared radiation by the removed parts of the infrared absorption layers, and the sensitivity of the infrared photodetector is lowered.

For the respective electrodes of the respective infrared absorption layers, areas necessary to form the electrodes must be ensured, which limits the downsizing.

Furthermore, in the case that the infrared photodetector devices of such structure are arrayed as imaging elements to thereby form an imaging device, read circuits associated with the respective pixels must be provided for respective wavelengths. This makes it very difficult to downsize such imaging device.

As described above, the multiwavelength infrared photodetector including a plurality of infrared absorption layers stacked vertically to the substrate has various inconveniences. These inconveniences are caused by that electrodes for reading electric signals of the absorption of infrared radiation must be provided for respective wavelengths of infrared radiation.

Then, the inventors of the present application had an idea that the inconveniences could be solved by a multiwavelength infrared photodetector which includes a single infrared absorption layer having sensitivities to a plurality of wavelengths of infrared radiation and which is so constructed that electric signals of absorption of infrared radiation of the respective wavelengths are discretely and independently read.

Then, the inventors of the present application have found that the single infrared absorption layer having sensitivities respectively to a plurality of wavelengths of infrared radiation may be an active layer which differs the infrared-sensible wavelength corresponding to polarization directions of the incident infrared ration.

Figure 1A:
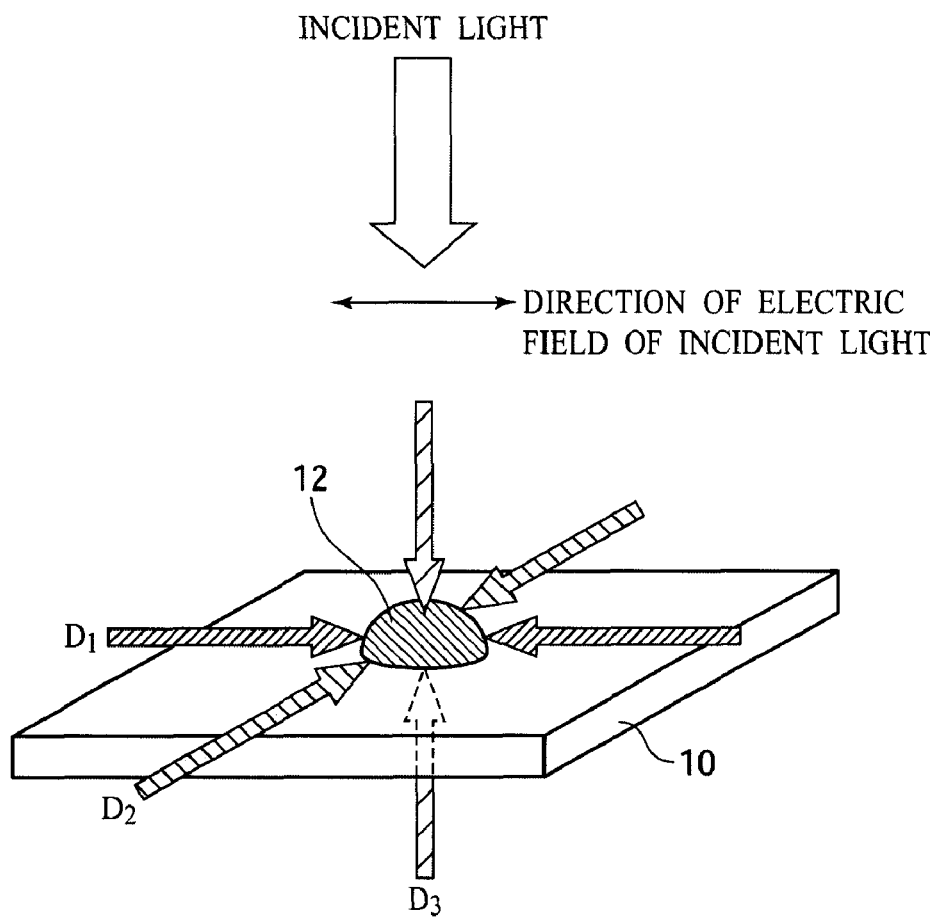
FIG. 1A is a diagrammatic view illustrating a quantum dot formed over a semiconductor substrate and directions in which the quantum confinement effect takes place.
Figure 1B:
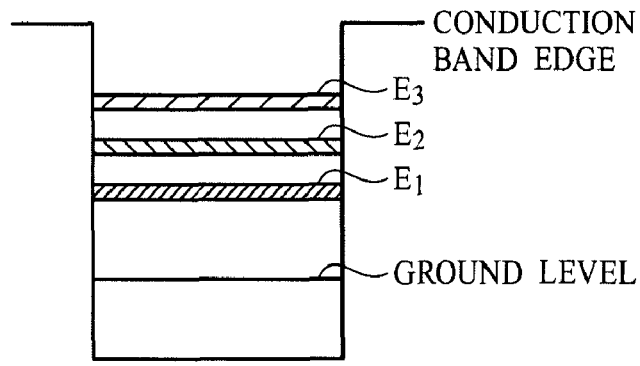
FIG. 1B is a view illustrating the quantum levels of the case that a quantum dot illustrated in FIG. 1A has configurational anisotropy and the dimensions are different from one another in direction $D_1$, direction $D_2$ and direction $D_3$, which are directions of the quantum confinement.
Figure 2:
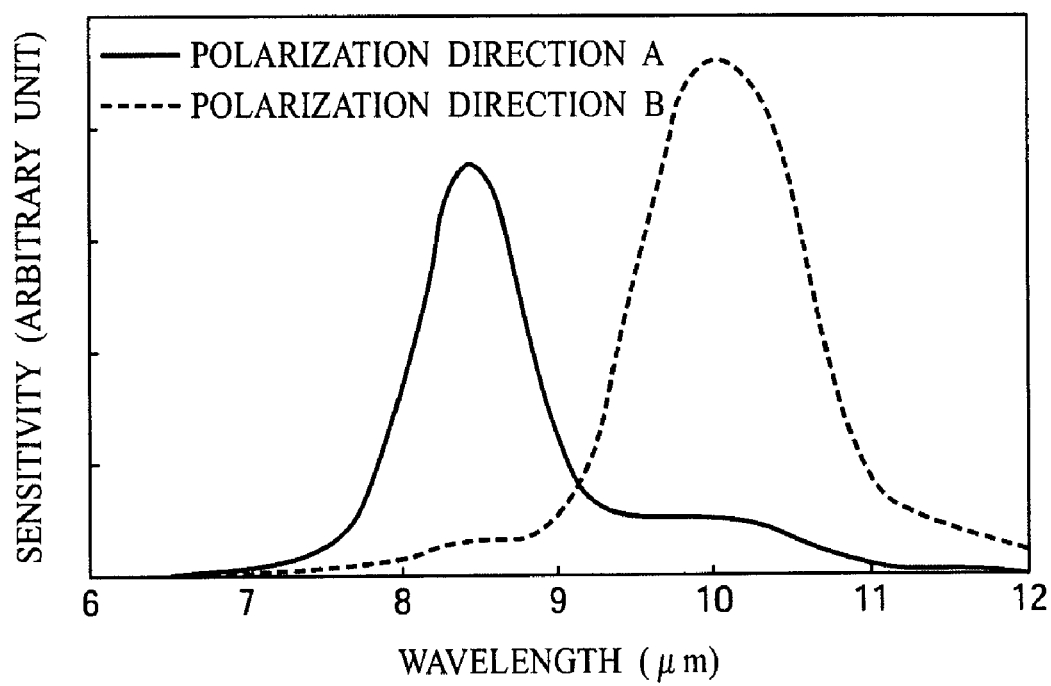
FIG. 2 is a graph illustrating the absorption spectra of the photoabsorption layer according to a first embodiment, which is sensitive to wavelengths different corresponding to polarization directions of the incident light.
Figure 3:
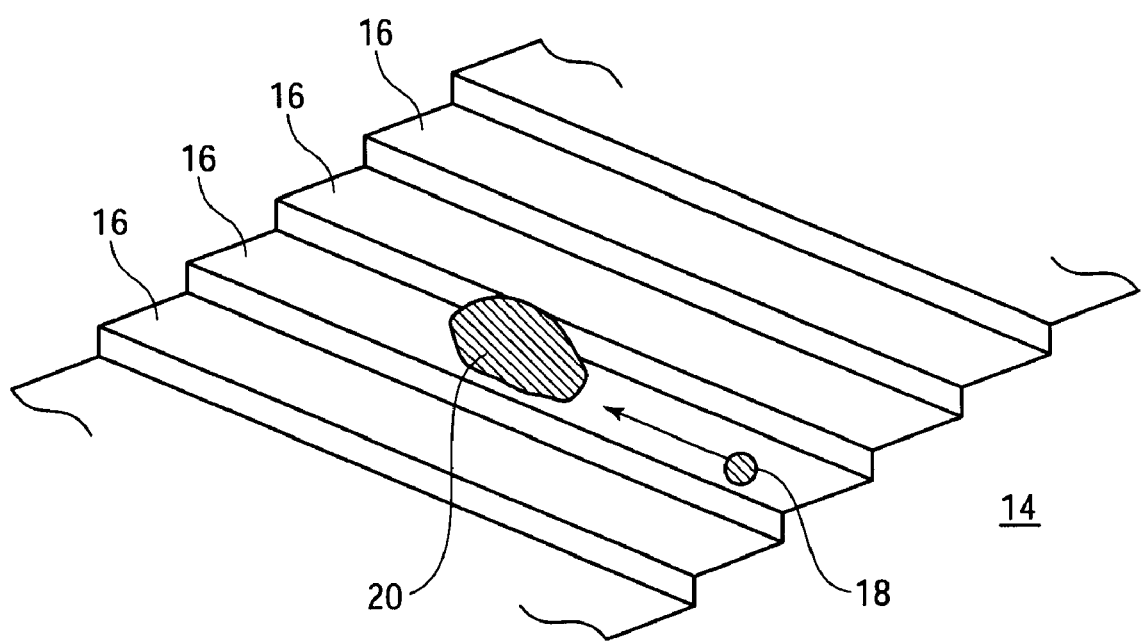
FIG. 3 is a diagrammatic view illustrating the growth of the quantum dots by the first embodiment.

The photodetector according to a first embodiment will be explained with reference to FIGS. 1 to 3. FIGS. 1A and 1B are diagrammatic views explaining the mechanism of the first embodiment. FIG. 2 is a graph illustrating absorption spectra of the photoabsorption layer of the present embodiment, whose infrared-sensitive wavelength differs corresponding to polarization directions of the incident light. FIG. 3 is a diagrammatic view illustrating the growth of the quantum dots according to the present embodiment.

The active layer which is sensitive to infrared ration of wavelengths different corresponding to polarization directions of the incident infrared radiation may be formed of, e.g., quantum dots, as will be described below.

FIG. 1A is a diagrammatic view of a quantum dot formed on a semiconductor substrate and the directions in which the quantum confinement effect takes place.

As illustrated, in the quantum dot 12 formed on the semiconductor substrate 10, the quantum confinement effect due to the potential barriers is generated in the respective tree directions, $D_1$ direction, $D_2$ direction and $D_3$ direction which are orthogonal to each other. In FIG. 1A, $D_1$ direction and $D_2$ direction are orthogonal to each other in the plane parallel to the semiconductor substrate 10, and $D_3$ direction is perpendicular to the plane parallel to the semiconductor substrate 10.

When the wave function of the carrier confined in the quantum dot is represent as $\Psi$, the transition probability between the i-th quantum level and the j-th quantum level, of the discrete quantum levels formed in the quantum dot is proportional to a matrix element between the quantum levels:

$$|\langle \Psi_i | e \cdot p | \Psi_j \rangle|^2$$

(refer to J. J. Sakurai, San Fu Tuan edited, Akio Sakurai translated, "Modern Quantum Mechanics (last volume)", Yoshioka Bookstore, May, 1989), wherein e is a field vector of light absorbed or emitted with transition, and p is a momentum operator of a carrier.

In this formula, a direction of the vector p corresponds to a motion direction of a carrier, and the vector e corresponds to a polarization direction of light. Accordingly, in this formula described above, it is seen that when a polarization direction of light is, e.g., x direction, the transition probability is maximum when the motion direction of a carrier confined in a quantum dot is x direction, and when the motion direction of a carrier confined in a quantum dot is y direction and z direction, the transition probability is 0.

Based on this, it is seen that the absorption or emission of light in a quantum dot becomes most intense for light polarized in a direction in parallel with a motion direction of a carrier in the quantum dot and becomes 0 for light polarized in a direction orthogonal to the motion direction of the carrier in the quantum dot.

Furthermore, the wavelength λ of the light absorbed or emitted upon this transition between levels is expressed by $$\lambda = hc/E$$

wherein an energy difference between the levels is E, the Planck constant is h, and a velocity of light in the free space is c.

Based on the above, energy differences of the quantum level among the respective directions in the quantum dot are set different from one another, whereby the wavelength of light absorbed in a quantum dot and exciting the carriers may be set to differ corresponding to the polarization directions thereof. The polarization direction of light emitted when the carriers relax in the quantum dot may be set to differ corresponding to the wavelengths.

Here, the wave function of the quantum dot, i.e., the quantum levels are determined by factors influencing the carrier confinement conditions. Such factors are configurational anisotropy of the quantum dot, i.e., dimensions of the quantum dot in the respective directions, intra-plane anisotropy of the strains applied to the quantum dot, etc.

FIG. 1B is a view illustrating the quantum levels of the case that a quantum dot 12 illustrated in FIG. 1A has configurational anisotropy; the dimensions are different from one another in the direction $D_1$, the direction $D_2$ and the direction $D_3$, which are directions of the quantum confinement. The dimensions of the quantum dot are different from one another in the direction $D_1$, the direction $D_2$ and the direction $D_3$, whereby, as illustrated, the excitation level $E_1$ in the direction $D_1$, the excitation level $E_2$ in the direction $D_2$ and the excitation level $E_3$ in the direction $D_3$ take energy positions different from one another.

Thus, an active layer of, e.g., a single quantum dot layer including quantum dots of dimensions different among directions or its layer structure is used as a photoabsorption layer, whereby the photoabsorption layer which absorbs light of different wavelengths corresponding to polarization directions, i.e., a photoabsorption layer which differs the light sensible wavelength corresponding to the polarization directions. An active layer of, e.g., a single quantum dot layer including quantum dots of dimensions different among directions or its layer structure is used as a photoemission layer, whereby the photoemission layer which emits light of multi-wavelength whose polarization directions differ depending on the wavelengths.

FIG. 2 is a graph illustrating an absorption spectra of a photoabsorption layer which differs the sensible wavelength corresponding to polarization directions of the incident light. In the graph, the absorption spectrum of the infrared radiation in a polarization direction A, and an absorption spectrum of the infrared radiation in a polarization direction B orthogonal to the polarization direction A. The photoabsorption layer the absorption spectra were measured on includes quantum dots which are different in the dimensions in a direction parallel with the polarization direction A and a direction parallel with the polarization direction B.

Based on the comparison with both spectra, it is seen that the infrared sensible wavelength in the polarization direction A and the infrared sensible wavelength in the polarization direction B are different from each other.

In the present embodiment, a quantum dot layer including quantum dots whose dimensions are different among directions is used as a photoabsorption layer or a photoemission layer to form a photodetector or a photoemission element.

The method of fabricating quantum dots forming the active layer of the photodetector or the photoemission element, which have different dimensions among directions is as exemplified below.

It has been reported that in growing quantum dots of $In_{0.4}Ga_{0.6}As$ on a GaAs substrate by, e.g., MBE (Molecular Beam Epitaxy), $As_4$ molecular beam is used as the As source to form anisotropic quantum dots (refer to Takeyoshi Sugaya et. al., "Improved optical properties of InAs quantum dots grown with an $As_2$ source using molecular beam epitaxy", J. Appl. Phys., Volume 100, 063107 (2006)). Such quantum dot growing method may be used to form the quantum dots having different dimensions among directions.

As the base substrate on which the quantum dots are to be grown, a crystal substrate having the surface inclined by several degrees from the cleavage plane, i.e., an inclined substrate is used, whereby the quantum dots of dimensions different among directions may be formed.

FIG. 3 illustrates the growth of the quantum dots on the inclined substrate.

As illustrated, on the surface of the inclined substrate 14, steps 16 of an atomic layer are arranged cyclically in parallel to each other. The quantum dot material 18 adhering to the surface of such inclined substrate 14 may move more easily in the direction parallel to the steps 16 than in the direction vertical to the steps 16. Accordingly, to a growing quantum dot 20, more quantum dot material 18 is fed in the direction parallel to the steps 16 than in the direction vertical to the steps 16. Consequently, the dimensions of the quantum dot to be formed are larger in the direction parallel to the steps 16 and smaller in the direction vertical to the steps 16.

Thus, the inclined substrate is used as the base substrate for growing the quantum dots, whereby the quantum dots may have dimensions different between the directions.

The quantum dots may have different dimensions between the directions by using the plane orientation dependency of the growth rate of quantum dots or by suitably selecting the quantum dot material and the base material so that the crystal lattice constant difference between the quantum dot material and the base material for the quantum dots to be grown on are different among directions.

A Second Embodiment

Figure 4:
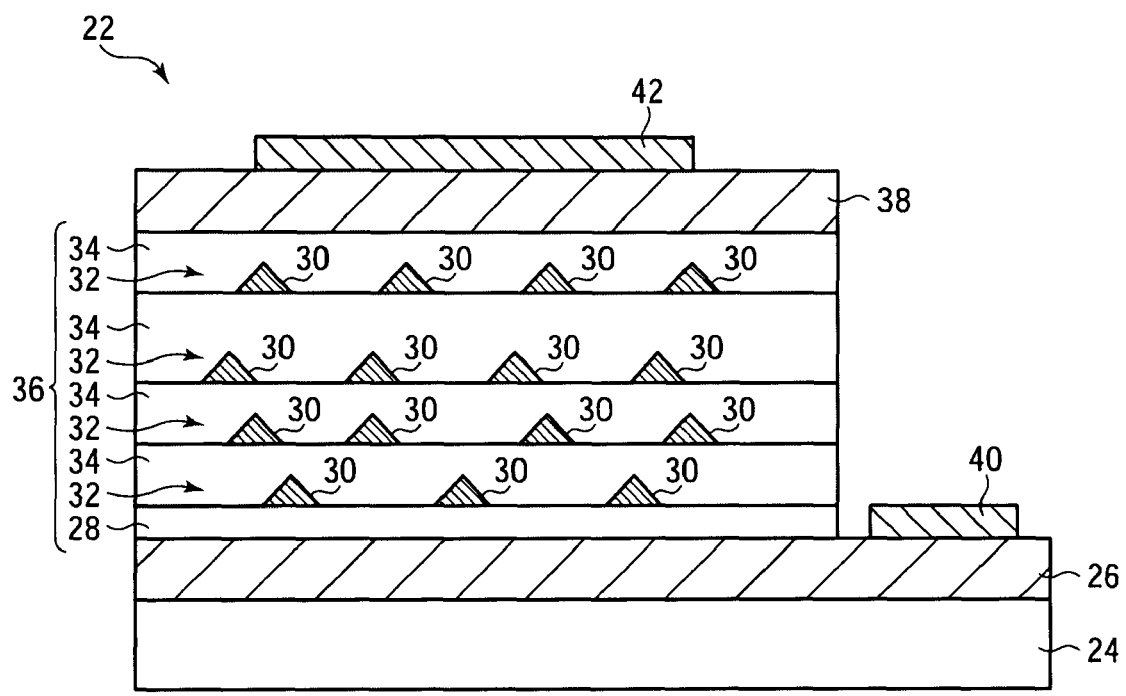
FIG. 4 is a sectional view illustrating the structure of the photodetector of the optical semiconductor device according to a second embodiment.

The optical semiconductor device according to a second embodiment will be explained with reference to FIGS. 4 to 9. FIG. 4 is a sectional view illustrating the structure of the photodetector of the optical semiconductor device according to the present embodiment. FIG. 5 is a diagrammatic view illustrating the general constitution of the optical semiconductor device according to the present embodiment. FIGS. 6A-8B are sectional views illustrating the method of manufacturing the photodetector according to the present embodiment. FIG. 9 is a diagrammatic view illustrating the general constitution of the optical semiconductor device according to a modification according to the present embodiment.

First, the structure of the optical semiconductor device according to the present embodiment will be explained with reference to FIGS. 4 and 5. The optical semiconductor device according to the present embodiment functions as a multi-wavelength infrared photodetector which can measure the infrared radiation intensities of discrete wavelengths.

First, the photodetector of the optical semiconductor device according to the present embodiment will be explained.

As illustrated in FIG. 4, over a semiconductor substrate 24 of a semi-insulating GaAs substrate, a lower electrode layer 26 of an n-type GaAs layer of, e.g., a 1000 nm-thickness is formed.

Over the lower electrode layer 26, an intermediate layer 28 of an i-type GaAs layer of, e.g., a 100 nm-thickness is formed.

Over the intermediate layer 28, a quantum dot layer 32 including a plurality of quantum dots 30 of InGaAs is formed. The composition ratio of the quantum dots 30 is, e.g., $In_{0.4}Ga_{0.6}As$. Over the quantum dot layer 32, an intermediate layer 34 of an i-type GaAs layer of, e.g., a 100 nm-thickness is formed, burying the quantum dots 30. Over the intermediate layer 34, the quantum dot layers 32 and the intermediate layers 34 are stacked repeatedly, e.g., three times.

Thus, an infrared absorption layer 36 including the intermediate layer 28, and the layer structure of the quantum dot layer 32 and the intermediate layer 34 stacked repeatedly, e.g., four times is formed over the lower electrode layer 26.

The quantum dots 30 forming each quantum dot layer 32 of the infrared absorption layer 36 are grown by MBE using $As_4$ molecular beams as the As source, as will described later, and each have configurational anisotropy and dimensions different among directions. Specifically, each quantum dot 30 has dimensions different among directions in the plane parallel to the substrate surface and has dimensions different among directions in the plane vertical to the direction of advance of the incident infrared radiation from an infrared radiation source. The infrared absorption layer 36 is sensitive to wavelengths different corresponding to polarization directions.

Over the uppermost intermediate layer 34 of the infrared absorption layer 36, an upper electrode layer 30 of an n-type GaAs layer of, e.g., a 1000 nm-thickness is formed.

In a partial region of the lower electrode layer 26, the upper electrode layer 38 and the infrared absorption layer 36 are removed, and over the lower electrode layer 26 in this region, an electrode 40 of an AuGe/Au layer is formed.

Over the upper electrode layer 38, an electrode 42 of an AuGe/Au layer is formed.

Thus, the photodetector 22 of the optical semiconductor device according to the present embodiment is constituted.

Next, the general constitution of the optical semiconductor device according to the present embodiment will be explained.

To the photodetector 22 illustrated in FIG. 4, as illustrated in FIG. 5, a read circuit 44 for reading electric signals generated by absorption of infrared radiation by the infrared absorption layer 36 is connected via the electrodes 40, 42. A plurality of the photodetectors 22 may be formed on the substrate in an array.

On the photodetector 22, for example, infrared radiation is incident from the infrared radiation source (not illustrated) vertically to the substrate surface from the surface of the semiconductor substrate 24, where the electrodes 40, 42 are not formed. As described above, each quantum dot 30, which has different dimensions among directions in the plane parallel with the substrate surface, has dimensions different among directions in plane vertical to the direction of advance of the infrared radiation.

A polarizer 46 for converting infrared radiation to be incident on the photodetector 22 to linearly polarized infrared radiation is disposed on the side of the photodetector 22, on which infrared radiation is incident. The direction of the polarizer 46 may be mechanically controlled so that the polarization direction of the linearly polarized infrared radiation which has passed through the polarizer 46 to be incident on the photodetector 22 may be controlled. The polarizer 46 is connected to a control unit 48 for controlling the direction of the polarizer 46.

To the control unit 48 and the read circuit 44, a synchronizing signal generator 50 for generating synchronizing signals for synchronizing the control of the direction of the polarizer 46 by the control unit 48 with the read of electric signals by the read circuit 44 is connected.

Thus, the optical semiconductor device according to the present embodiment is constituted.

In the optical semiconductor device according to the present embodiment, the infrared absorption layer 36 of the photodetector 22 is formed of the quantum dot layer 32 formed of quantum dots 30 each having dimensions different among directions stacked, and the infrared sensible wavelength is different corresponding to the polarization direction. By the polarizer 46, whose direction is mechanically controlled, infrared radiation from the infrared radiation source is converted to linearly polarized infrared radiation, and the linearly polarized infrared radiation having the polarization direction controlled is incident on such infrared absorption layer 36.

The infrared absorption layer 36 where the linearly polarized infrared radiation has been incident on absorbs infrared radiation of a sensible wavelength corresponding to the polarization direction of the infrared radiation controlled by the polarizer 46 and generates photocurrent or photovoltaic power by the photoelectric conversion. The photocurrent or the photovoltaic power, i.e., electric signals, accompanying the absorption of the infrared radiation is read by the read circuit 44 in synchronization with the control of the polarization direction by the polarizer 46, and the intensity of the infrared radiation of the sensible wavelength is measure, based on the read electric signals.

Thus, in the optical semiconductor device according to the present embodiment, polarization direction of the infrared radiation to be incident on the photodetector 22 is controlled, whereby infrared radiation intensities of discrete wavelengths may be measured.

As described above, the optical semiconductor device according to the present embodiment can measure independently infrared radiation intensities of discrete wavelengths by the single infrared absorption layer 36 which differs the sensible wavelength corresponding to the polarization directions without the necessity of a plural infrared absorption layers.

Thus, the optical semiconductor device according to the present embodiment makes the structure of the photodetector 22 simple, does not complicate the manufacturing steps thereof, and can reduce the area of the region necessary for forming the electrodes. The read circuit 44 for reading signals from the photodetector 22 may be made simple and small. According to the present embodiment, the optical semiconductor device may be easily downsized.

Next, the method of manufacturing the photodetector 22 according to the present embodiment illustrated in FIG. 4 will be explained with reference to FIGS. 6A to 8B.

Figure 6A:
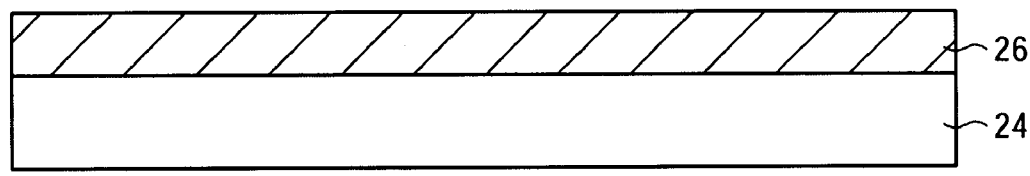
FIGS. 6A-6D, 7A-7B and 8A-8B are sectional views illustrating the method of manufacturing the photodetector according to the second embodiment.

First, over the semiconductor substrate 24 of a semi-insulating GaAs substrate, the lower electrode layer 26 of an n-type GaAs layer is grown at, e.g., a 600° C. substrate temperature by, e.g., MBE method (FIG. 6A). The film thickness of the lower electrode layer 26 is, e.g., 1000 nm. The lower electrode layer 26 is doped with, e.g., Si as an n-type impurity and in, e.g., a $2\times10^{18}$ cm$^{-3}$ concentration.

Figure 6B:
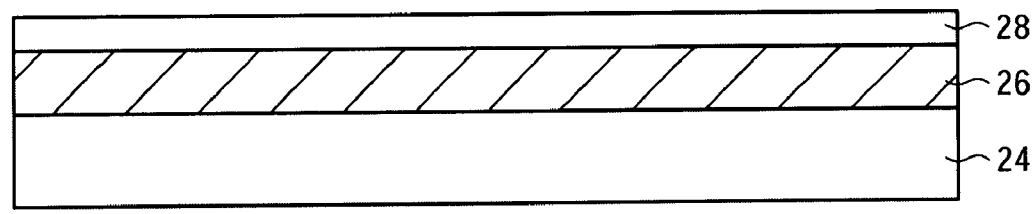

Next, over the lower electrode layer 26, the intermediate layer 28 of an i-type GaAs layer is grown by, e.g., MBE method (FIG. 6B). The film thickness of the intermediate layer 28 is, e.g., 100 nm. While the intermediate layer 28 is growing, the substrate temperature is lowered to, e.g., 400° C. which is suitable for the growth of the quantum dots 30 which will follow.

Figure 6C:
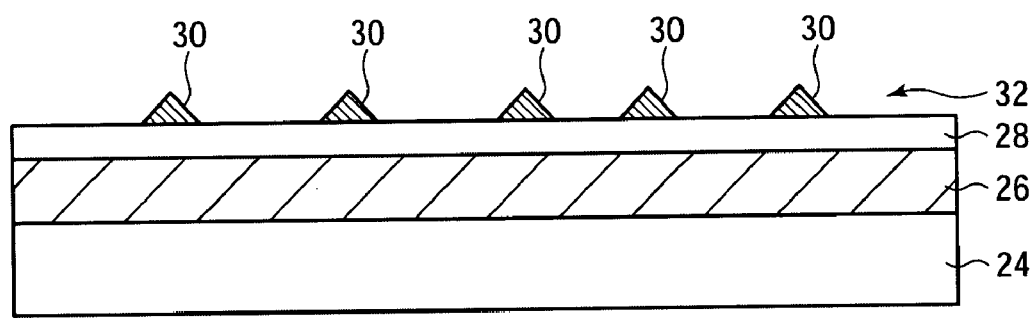

Then, over the intermediate layer 28, a plurality of the quantum dots 30 of $In_{0.4}Ga_{0.6}As$ are grown to form the quantum dot layer 32 (FIG. 6C). The quantum dots 30 of $In_{0.4}Ga_{0.6}As$ are grown at, e.g., a 400° C. substrate temperature by Stranski-Krastanov crystal growth mode by using $As_4$ molecular beam as As source and feeding $In_{0.4}Ga_{0.6}As$ of a total feed amount corresponding to 8 ML (monolayer) at, e.g., a 0.1 ML/s rate. In this crystal growth mode, $In_{0.4}Ga_{0.6}As$ of not less than an amount corresponding to the critical thickness is fed, whereby a compressive stress in the $In_{0.4}Ga_{0.6}As$ layer is increased and the plurality of quantum dots 30 of $In_{0.4}Ga_{0.6}As$ are self-assembled. The $As_4$ molecular beam is used as As source, whereby the quantum dots 30 having dimensions different among directions may be formed.

Figure 6D:
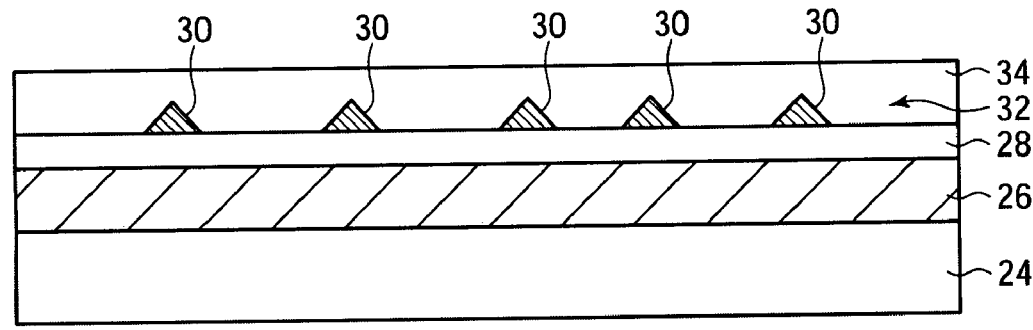

Then, over the quantum dot layer 32, the intermediate layer 34 of an i-type GaAs layer is grown by, e.g., MBE method, burying the plural quantum dots 30 (FIG. 6D). The film thickness of the intermediate layer 34 is, e.g., 100 nm.

Figure 7A:
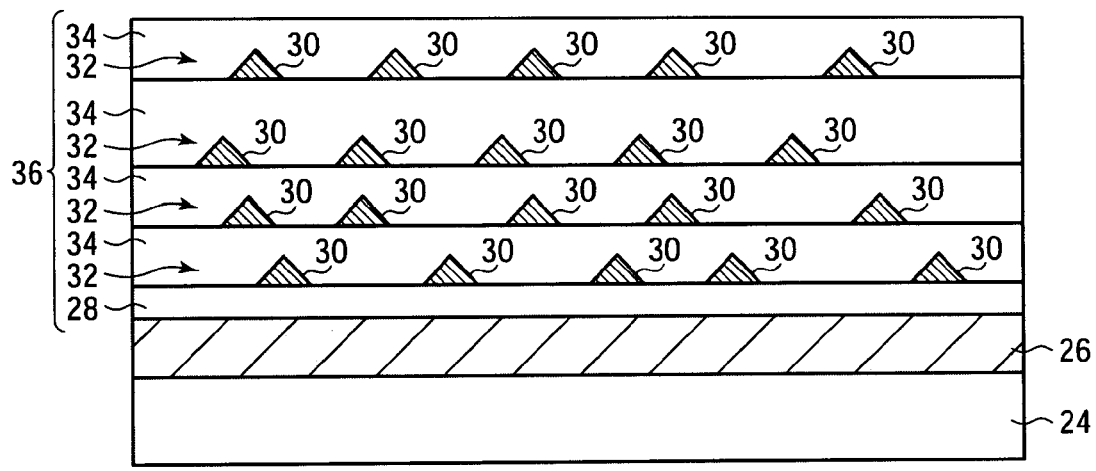

Then, in the same way as described above, the quantum dot layer 32 and the intermediate layer 34 are grown repeatedly a required times, e.g., three times. The respective quantum dot layers 32 are grown under, e.g., the same growth conditions as describe above. While the upper most intermediate layer 34 is growing, the substrate temperature is raised to a temperature suitable for the growth of the upper electrode layer 38 to be grown, e.g., 600° C. Thus, the infrared absorption layer 36 including the intermediate layer 28, the quantum dot layers 32 and the intermediate layers 34 formed repeatedly, e.g., four times over the intermediate layer 28 is formed over the lower electrode 26 (FIG. 7A).

Figure 7B:
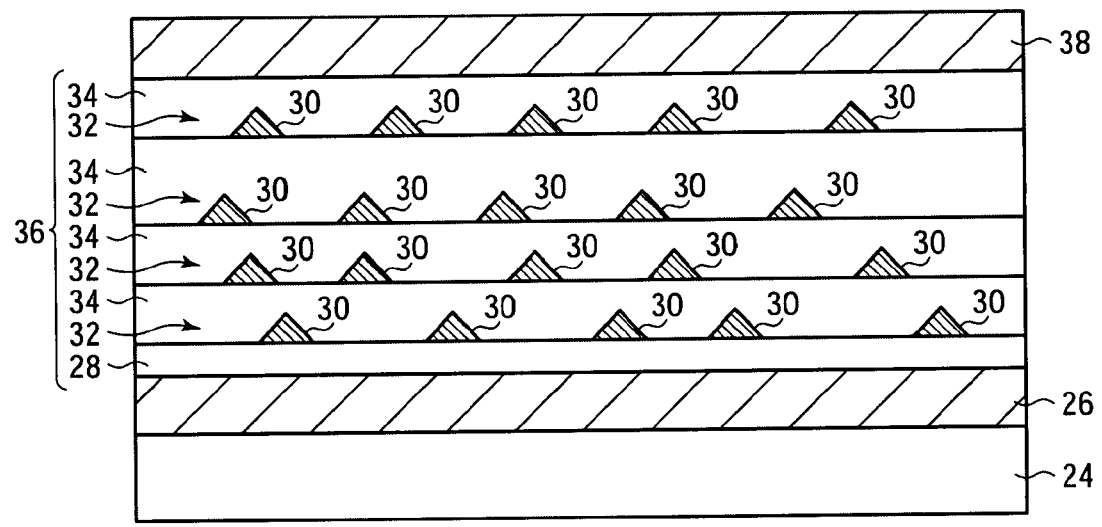

Next, over the infrared absorption layer 36, the upper electrode layer 38 of an n-type GaAs layer is grown at, e.g., 600° C. substrate temperature by, e.g., MBE method (FIG. 7B). The film thickness of the upper electrode 38 is, e.g., 1000 nm. In doping the upper electrode layer 38, Si, for example, is used as the n-type impurity, and the concentration is, e.g., $2\times10^{18}$ cm$^{-3}$.

Figure 8A:
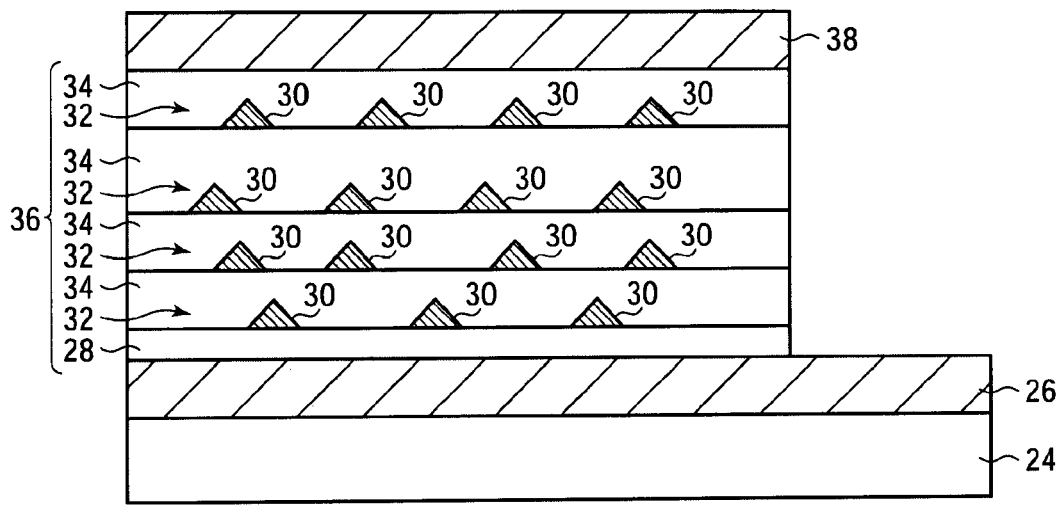
Figure 9:
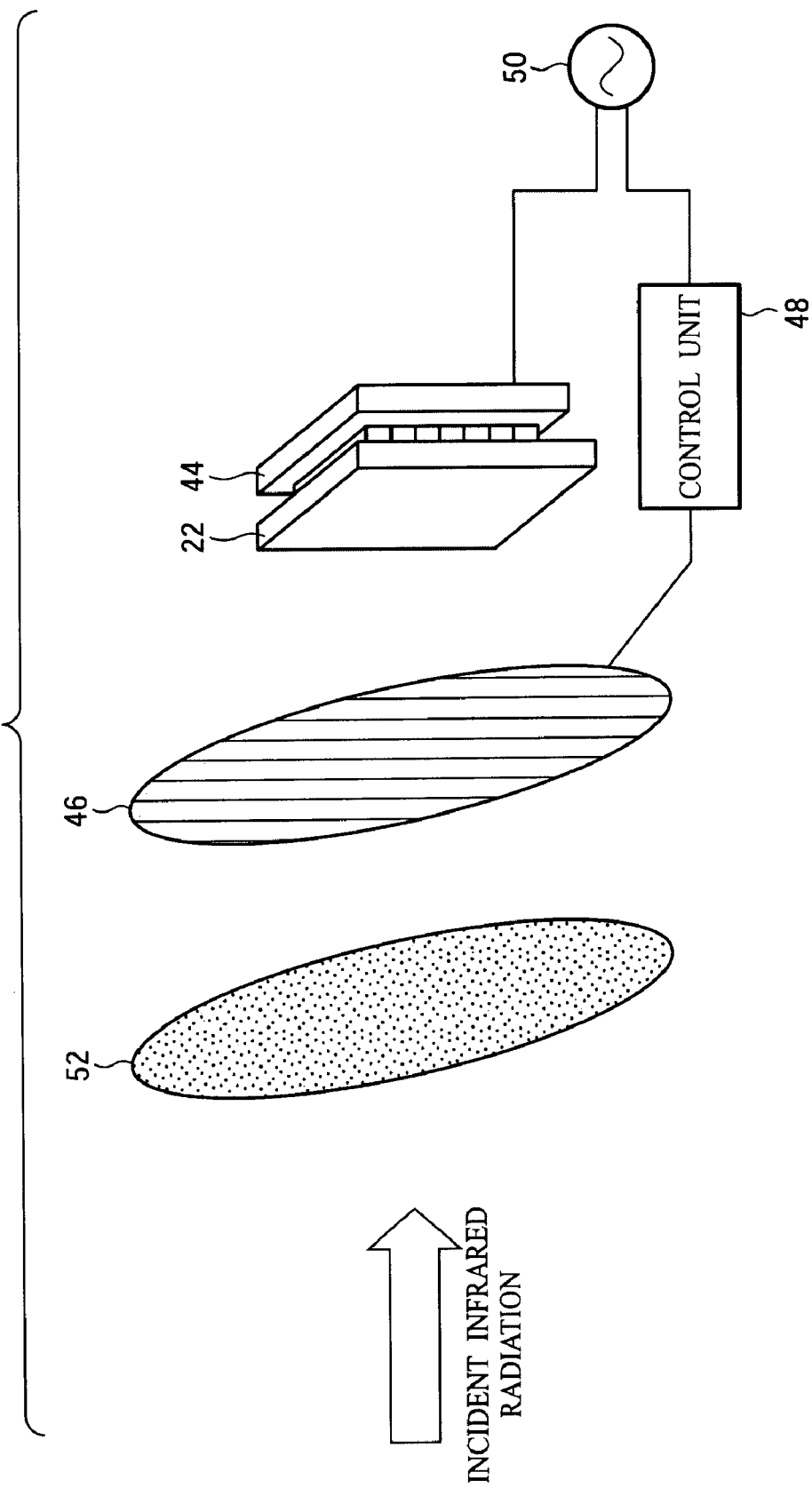
FIG. 9 is a diagrammatic view illustrating the general constitution of the optical semiconductor device according to a modification of the second embodiment.

Next, by photolithography and dry etching, the upper electrode layer 38 and the infrared absorption layer 36 in the lower electrode forming region are removed to expose the surface of the lower electrode layer 26 (FIG. 8A).

Figure 8B:
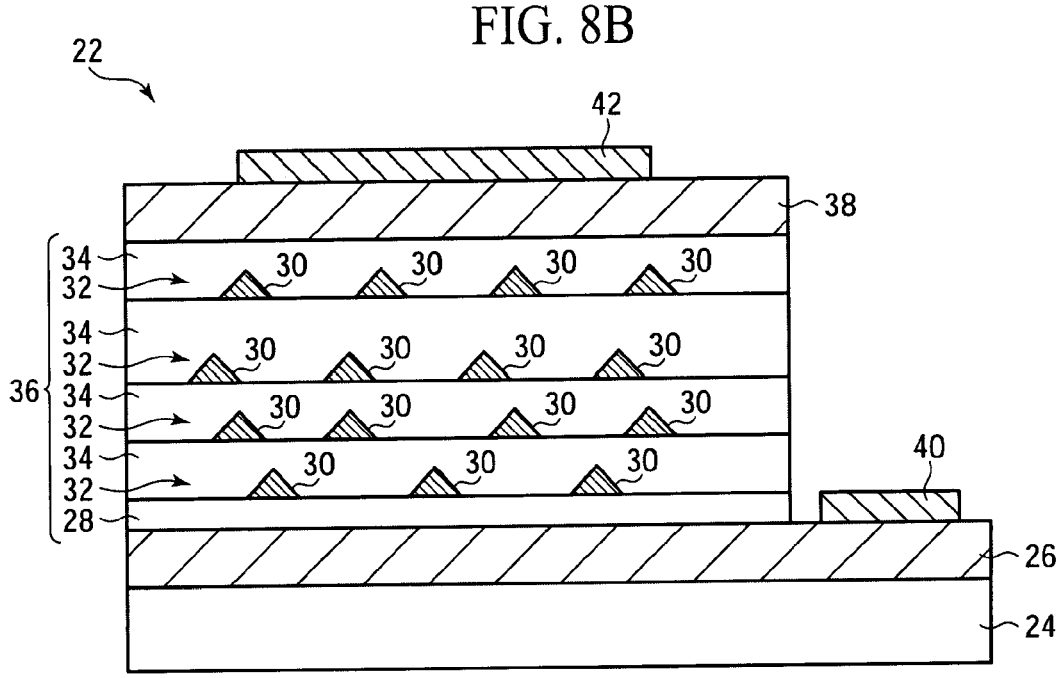

Next, by, e.g., metal evaporation method, over the exposed lower electrode layer 26 and the exposed upper electrode layer 38, the electrodes 40, 42 formed of an AuGe/Au layer are respectively formed, and the photodetector 22 according to the present embodiment is completed (FIG. 8B).

As described above, according to the present embodiment, the quantum dot layer 38 formed of quantum dots 30 having dimensions different among directions are stacked to form the infrared absorption layer 36 which differs the sensible wavelength corresponding to polarization directions, and, by the polarizer 46 whose direction is mechanically controlled, infrared radiation from an infrared radiation source is converted to the linearly polarized infrared radiation, and the linearly polarized infrared radiation has the polarization direction controlled to be incident on the single infrared absorption layer 36, whereby infrared radiation intensities of respective wavelengths may be independently measured.

Thus, according to the present embodiment, the structure of the photodetector 22 is simple, and its manufacturing steps are not complicated, the area of the regions necessary for forming the electrodes may be reduced, and the read circuit 44 can be simple and downsized, whereby the optical semiconductor device may be easily downsized.

In the above, four layers, for example, of the quantum dot layers 32 are grown under the same growth conditions, but a plurality of the quantum dot layers 32 to be stacked may be grown under different growth conditions. A plurality of quantum dot layers 32 are grown under different growth conditions, whereby the dimensions or the configuration of the quantum dots may be different among the plural quantum dot layers 32. The dimensions or the configuration of the quantum dots 30 are different among a plurality of quantum dot layers 32, whereby the wavelengths of the infrared radiation absorbed by the plural quantum dot layers 32 may be made different from each other, and the wavelength number of infrared radiation the infrared absorption layer 36 is sensitive to may be increased.

For example, one or several layers of, e.g., four quantum dot layers 32 forming the infrared absorption layer 36 are grown by feeding, e.g., $In_{0.4}Ga_{0.6}As$ of a total feed amount corresponding to 8 ML at, e.g., a 0.1 ML/s rate. On the other hand, the other quantum dot layers 32 are grown by feeding, e.g., $In_{0.4}Ga_{0.6}As$ of a total feed amount corresponding to 10 ML at, e.g., a 0.1 ML/s rate.

A plurality of the quantum dot layers 32 thus grown under different growth conditions are stacked to form the infrared absorption layer 36, whereby the wavelength number of infrared radiation the infrared absorption layer 36 is sensitive to may be increased.

The infrared absorption layer 36 may be formed by stacking a plurality of quantum dot layers 32 of different materials other than stacking a plurality of the quantum dot layers 32 grown under different growth conditions. Thus, a plurality of the quantum dot layers 32 formed of a plurality of quantum dots 30 whose dimensions are different among directions are formed of different material, whereby wavelengths of infrared radiation to be absorbed by the plural quantum dot layers 32 may be different from each other, and the wavelength number of infrared radiation the infrared absorption layer 36 is sensitive to may be also increased.

In the case that the wavelength number of infrared radiation the infrared absorption layer 36 is sensitive to is thus increased, in addition to the structure illustrated in FIG. 5, a wavelength filter is disposed before the polarizer 46 to thereby restrict a wavelength range of infrared radiation to be incident on the photodetector 22 to a specific wavelength range containing a prescribed wavelength to be measured. FIG. 9 is a diagrammatic view illustrating the general constitution of the optical semiconductor device having the wavelength number of infrared radiation the infrared absorption layer 36 is sensitive to increased.

As illustrated, before the polarizer 46, i.e., on the side of the polarizer 46, where infrared radiation is incident, a wavelength filter 52 which transmits infrared radiation of a specific wavelength range containing a prescribed wavelength to be measured is disposed. As the wavelength filter 52, a band-pass filter, a high-pass filter, a low-pass filter or others may be used corresponding to wavelengths of infrared radiation to be measured.

On the polarizer 46, infrared radiation of a prescribed wavelength range containing a wavelength to be measured out of the infrared radiation from an infrared radiation source is incident via the wavelength filter 52. The infrared radiation of the specific wavelength range incident on the polarizer 46 is converted to linearly polarized light by the polarizer 46 as described above and has the polarization direction controlled to be incident on the photodetector 22.

Thus, a wavelength range of infrared radiation to be incident on the photodetector 22 is restricted by the wavelength filter 52, whereby infrared radiation intensities may be measured independently for respective plural wavelengths the infrared absorption layer 36 is sensitive to.

A Third Embodiment

Figure 10:
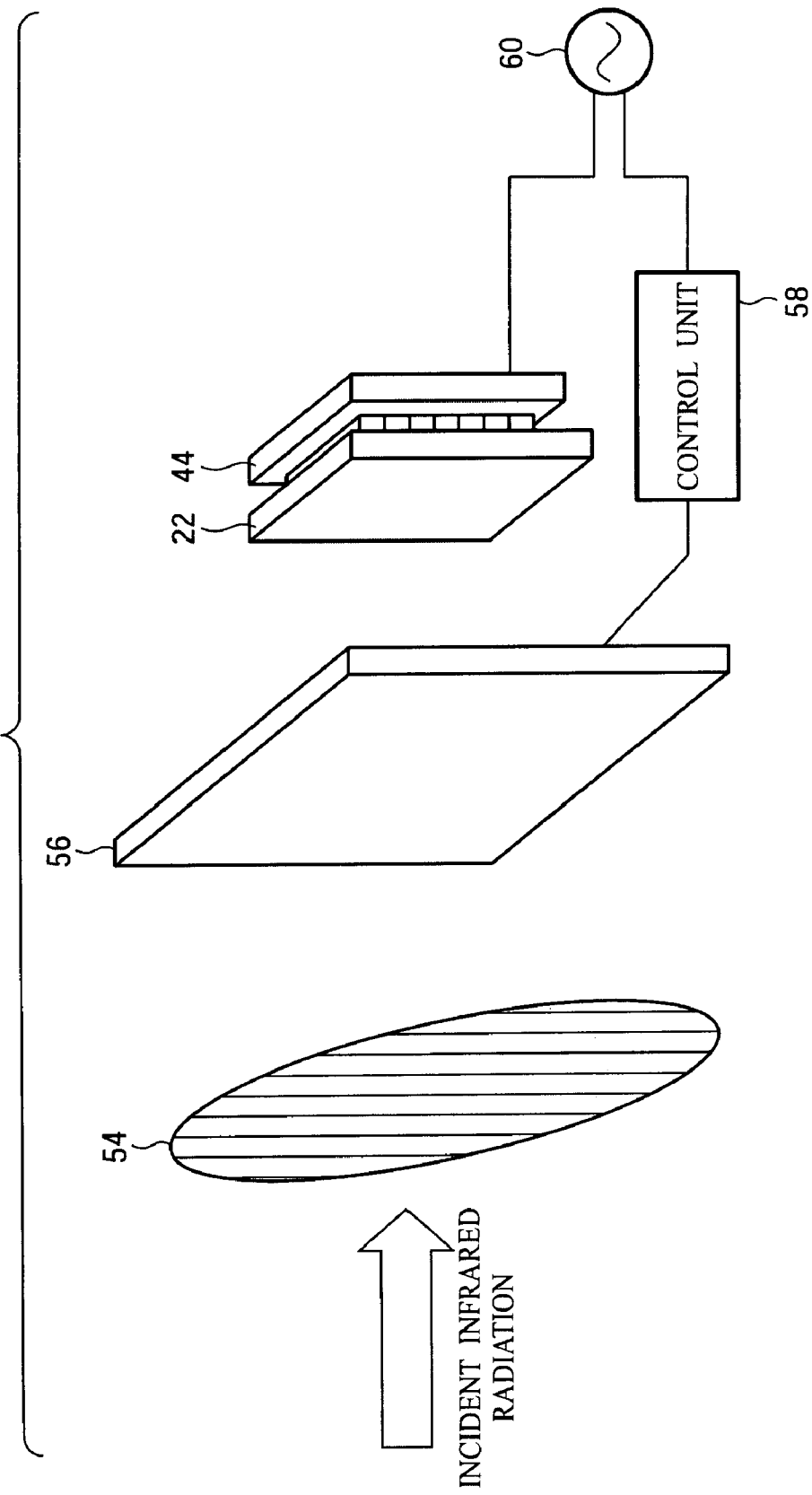
FIG. 10 is a diagrammatic view illustrating the general constitution of the optical semiconductor device according to a third embodiment.

The optical semiconductor device according to a third embodiment will be explained with reference to FIG. 10. FIG. 10 is a diagrammatic view illustrating the general constitution of the optical semiconductor device according to the present embodiment. The same members of the present embodiment as those of the optical semiconductor device according to the second embodiment are represented by the same reference numbers not to repeat or to simplify their explanation.

The basic constitution of the optical semiconductor device according to the present embodiment is substantially the same as that of the optical semiconductor device according to the second embodiment. The optical semiconductor device according to the present embodiment is different from the optical semiconductor device according to the second embodiment in that in the former, in place of the polarizer 46 whose direction is controlled for controlling the polarization direction of the linearly polarized light, includes a polarizer 54 which converts infrared radiation from an infrared radiation source to linearly polarized light, and a liquid crystal filter 56 which changes the polarization direction of the linearly polarized light from the polarizer 52.

As illustrated in FIG. 10, as in the optical semiconductor device according to the first embodiment, the read circuit 44 is connected to the photodetector 22.

On the side of the photodetector 22, where infrared radiation is incident, a polarizer 54 which converts the infrared radiation to be incident on the photodetector 22 to linearly polarized infrared radiation is disposed. The direction of the polarizer 54 is fixed to a prescribed direction.

The liquid crystal filter 56 which changes the polarization direction of the linearly polarized infrared radiation from the polarizer 54 is disposed between the polarizer 54 and the photodetector 22. A control unit 58 which controls the change of the polarization direction by the liquid crystal filter 56 is connected to the liquid crystal filter 56. The liquid crystal filter 56 changes, based on electric signals from the control unit 58, the orientation of the liquid crystal molecules and changes the polarization direction of the linearly polarized infrared radiation from the polarizer 54.

A synchronizing signal generating unit 60 which generates synchronizing signals for synchronizing the control by the control unit 58 for the change of the polarization direction by the liquid crystal filter 56 with the read of the electric signals by the read circuit 44 is connected to the control unit 58 and the read circuit 44.

In the optical semiconductor device according to the present embodiment, infrared radiation from an infrared radiation source is converted to the linearly polarized infrared radiation by the polarizer 54, and the linearly polarized infrared radiation has the polarization direction changed by the liquid crystal filter 56 to be incident on the infrared absorption layer 36 of the photodetector 22.

The infrared absorption layer 36 of the photodetector 22 where the linearly polarized infrared radiation has been incident on absorbs the infrared radiation of the sensible wavelength corresponding to a polarization direction of the infrared radiation controlled by the liquid crystal filter 56. The electric signals accompanying the absorption of the infrared radiation is read by the read circuit 44 in synchronization with the control of the polarization direction by the liquid crystal filter 56, and the intensity of the infrared radiation of the wavelength is measure, based on the read electric signals. Thus, in the optical semiconductor device according to the present embodiment, polarization direction of the infrared radiation to be incident on the photodetector 22 is controlled, whereby infrared radiation intensities of discrete wavelengths may be measured.

As described above, it is possible that infrared radiation from an infrared radiation source is converted to the linearly polarized infrared radiation by the polarizer 54, and the linearly polarized infrared radiation has the polarized direction changed by the liquid crystal filter 56 to be incident on the infrared absorption layer 36.

A Fourth Embodiment

Figure 11:
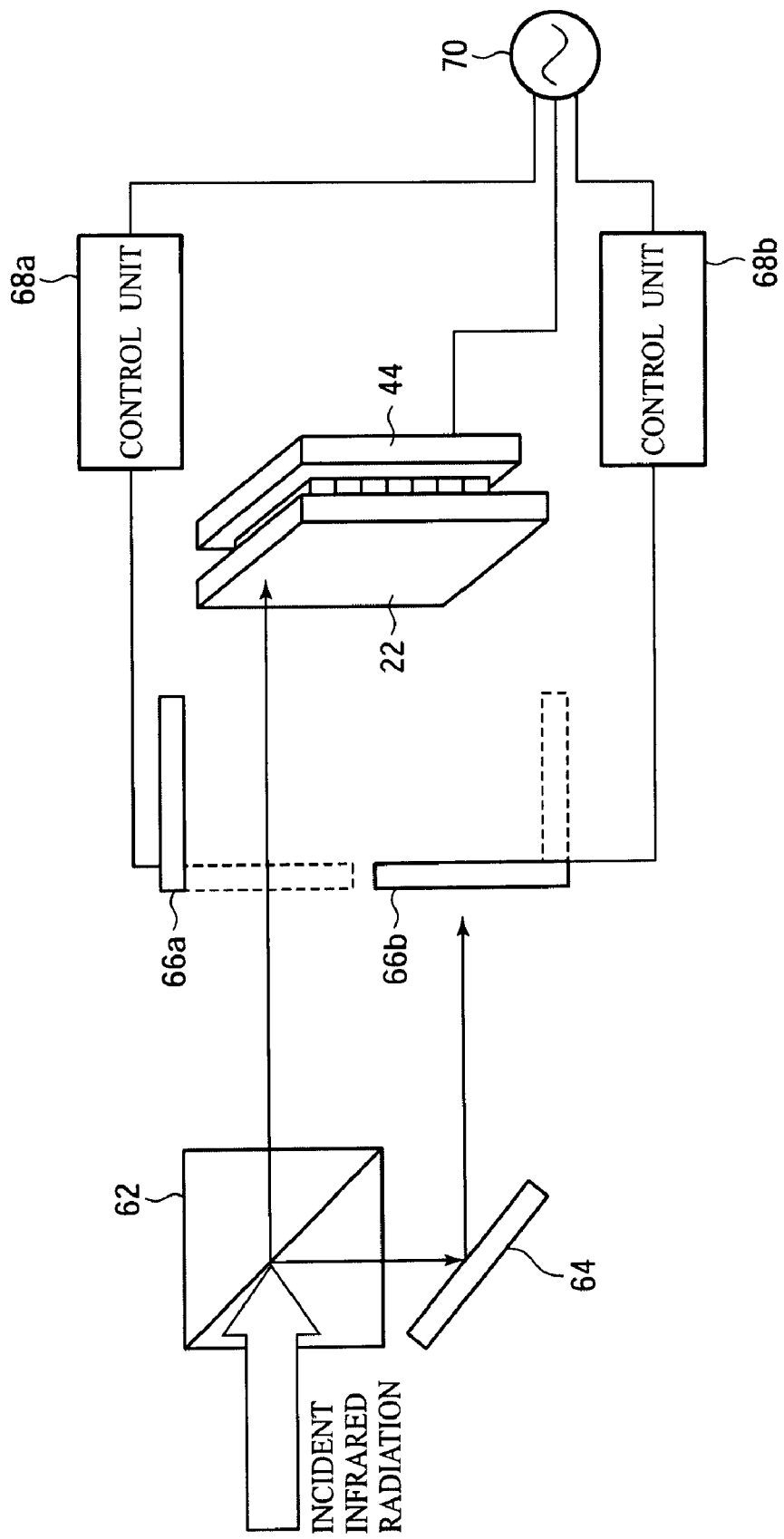
FIG. 11 is a diagrammatic view illustrating the general constitution of the optical semiconductor device according to a fourth embodiment.

The optical semiconductor device according to a fourth embodiment will be explained with reference to FIG. 11. FIG. 11 is a diagrammatic view illustrating the general constitution of the optical semiconductor device according to the present embodiment. The same members of the present embodiment as those of the optical semiconductor device according to the second and the third embodiments are represented by the same reference numbers not to repeat or to simplify their explanation.

The basic constitution of the optical semiconductor device according to the present embodiment is substantially the same as that of the optical semiconductor device according to the second embodiment. The optical semiconductor device according to the present embodiment is different from the optical semiconductor device according to the second embodiment in that in the former, in place of the polarizer 46 whose direction is controlled so as to control the polarization direction of the linearly polarized light, a polarization beam splitter 62 and a pair of shutters 66*a*, 66*b* are used to apply prescribed linearly polarized components of infrared radiation from an infrared radiation source to the photodetector 22.

As illustrated in FIG. 11, a read circuit 44 is connected to the photodetector 22, as in the optical semiconductor device according to the second embodiment.

On the side of the photodetector 22, where infrared radiation is incident, the polarization beam splitter 62 which splits infrared radiation from an infrared radiation source into two linearly polarized light components which cross each other, i.e., a P-polarized component and S-polarized component is disposed. The P-polarized component passes through the polarization beam splitter 62 and advances toward the photodetector 22. The S-polarized component is reflected on the polarization beam splitter 62 and further reflected on a mirror 64 disposed near the polarization beam splitter 62 to advance toward the photodetector 22.

Between the polarization beam splitter 62 and the photodetector 22, the shutters 66*a*, 66*b* are disposed.

One of the shutters 66*a* opens and closes in the optical path of the P-polarized component advancing toward the photodetector 22. With the shutter 66*a* opened, the P-polarized component is incident on the photodetector 22, and with the shutter 66*a* closed, the incidence of the P-polarized component on the photodetector 22 is blocked. A control unit 68*a* for controlling the opening and closing operation of the shutter 66*a* is connected to the shutter 66*a*.

The other of the shutters 66*b* opens and closes in the optical path of the S-polarized component advancing toward the photodetector 22. With the shutter 66*b* opened, the S-polarized component is incident on the photodetector 22, and with the shutter 66*b* closed, the incidence of the S-polarized component on the photodetector 22 is blocked. A control unit 68*b* for controlling the opening and closing operation of the shutter 66*b* is connected to the shutter 66*b*.

The opening and closing operation of the shutters 66*a*, 66*b* is controlled by the control units 68*a*, 68*b* so that one is opened while the other is closed. Thus, one of the P-polarized component and the S-polarized component is selectively applied to the photodetector 22.

To the control units 68*a*, 68*b* and the read circuit 44, a synchronizing signal generator 70 which generates synchronizing signals for synchronizing the control of the opening and closing operation of the shutters 66*a*, 66*b* by the control units 68*a*, 68*b* and the read of electric signals by the read circuit 44 with each other is connected.

In the optical semiconductor device according to the present embodiment, the polarization beam splitter 62 splits the infrared radiation from the infrared radiation source into the P-polarized component and the S-polarized component, and one of the linearly polarized components is selectively incident on by the shutters 66*a*, 66*b*.

The infrared absorption layer 36 of the photodetector 22 the P-polarized component or the S-polarized component has been incident on absorbs the infrared radiation of the sensible wavelength corresponding to a polarization direction of the P-polarized component or the S-polarized component. The electric signals accompanying the absorption of this infrared radiation are read by the read circuit 44 in synchronization with the control of the opening and closing operation of the shutters 66*a*, 66*b* by the control units 68*a*, 68*b*, and based on the read electric signals, the intensity of the infrared radiation of the wavelength is measured. Thus, in the optical semiconductor device according to the present embodiment, the linear polarized components of the infrared radiation incident on the photodetector 22 are controlled, whereby infrared radiation intensities of respective wavelengths may be measured.

As described above, infrared radiation from an infrared radiation source is split into the P-polarized component and the S-polarized component by the polarization beam splitter 62, and one of the linearly polarized components is applied to the infrared absorption layer 36 by the shutters 66*a*, 66*b*.

A Fifth Embodiment

The method of manufacturing the photodetector according to a fifth embodiment will be explained with reference to FIGS. 12A-13B. FIGS. 12A-13B are sectional views illustrating the method of manufacturing the photodetector according to the present embodiment. The same members of the present embodiment as those of the optical semiconductor device according to the second to the fourth embodiments are represented by the same reference numbers not to repeat or to simplify their explanation.

In the second embodiment, the quantum dots 30 having different dimensions among directions are grown by MBE method using $As_4$ molecular beams as the As source, but the quantum dots 30 which are different in the dimensions among directions may be grown by other various methods.

In the present embodiment, as the base substrate for the quantum dots 30 to be grown on, an inclined substrate 72 having the surface inclined from a prescribed plane orientation is used to thereby grow the quantum dots 30 whose dimensions are different among directions.

Figure 12A:
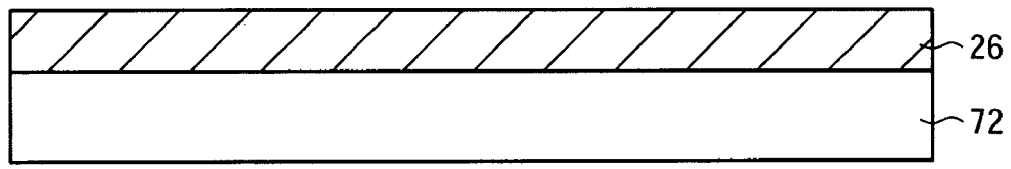
FIGS. 12A-12D and 13A-13B are sectional views illustrating the method of manufacturing the photodetector according to a fifth embodiment.

First, over the inclined substrate 72, the lower electrode layer 26 of an n-type GaAs layer is grown by, e.g., MBE method at, e.g., a 600° C. substrate temperature (FIG. 12A). As the inclined substrate 72, a semi-insulating GaAs substrate, e.g., having the surface inclined toward (111) direction by 5° from (100) plane orientation is used.

Figure 12B:
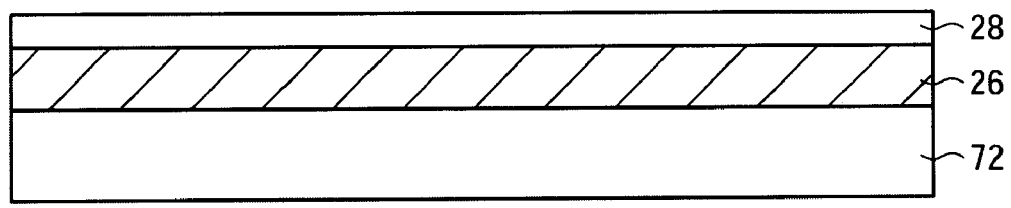

Next, over the lower electrode layer 26, the intermediate layer 28 of an i-type GaAs layer is grown by, e.g., MBE method (FIG. 12B). The film thickness of the intermediate layer 28 is, e.g., 100 nm. While the intermediate layer 28 is grown, the substrate temperature is lowered to, e.g., 400° C. suitable for the following growth of the quantum dots 30.

Figure 12C:
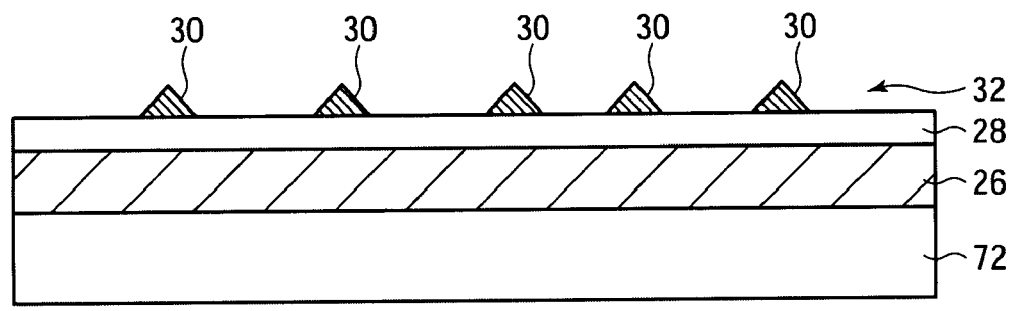

Next, over the intermediate layer 28, a plurality of quantum dots 30 of InGaAs are grown by MBE method to form the quantum dot layer 32 (FIG. 12C). The quantum dots 30 of InGaAs are grown at, e.g., a 400° C. substrate temperature by Stranski-Krastanov crystal growth mode by feeding InGaAs of a total feed amount corresponding to 8 ML at, e.g., a 0.1 ML/s rate. In the present embodiment, as the base substrate for growing the quantum dots 30, the inclines substrate 72 is used, whereby the quantum dots 30 having dimensions different among directions may be formed.

Figure 12D:
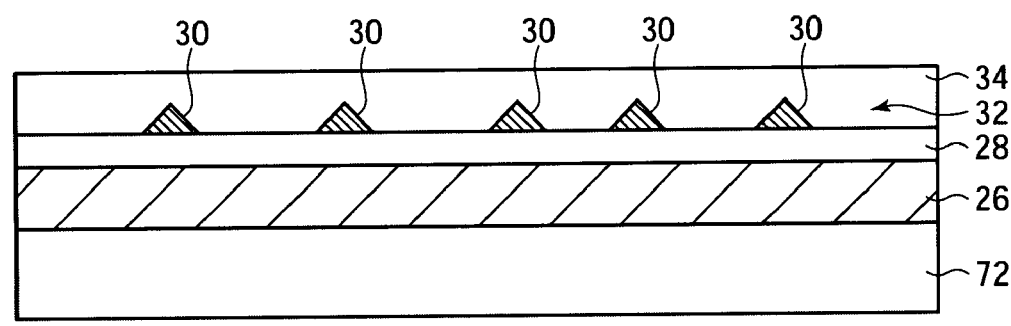

Next, over the quantum dot layer 32, the intermediate layer 34 of an i-type GaAs layer is formed by, e.g., MBE method, burying the plural quantum dots 30 (FIG. 12D). The film thickness of the intermediate layer is, e.g., 100 nm.

Figure 13A:
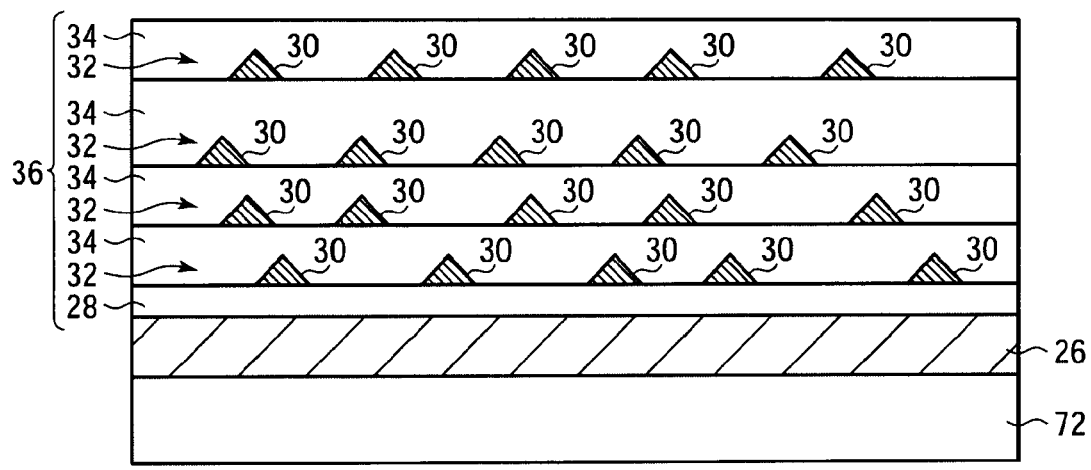

Next, over the intermediate layer 34, in the same way as described above, the quantum dot layers 32 and the intermediate layers 34 are grown repeatedly required times, e.g., three times. The respective quantum dot layers 32 are grown under the same growth conditions as, e.g., described above. Thus, over the lower electrode layer 26, the infrared absorption layer 36 of the layer structure of the intermediate layer 28, and the quantum dot layer 32 and the intermediate layer 34 repeatedly stacked by, e.g., four times over the intermediate layer 28 is formed over the lower electrode layer 26 (FIG. 13A).

Figure 13B:
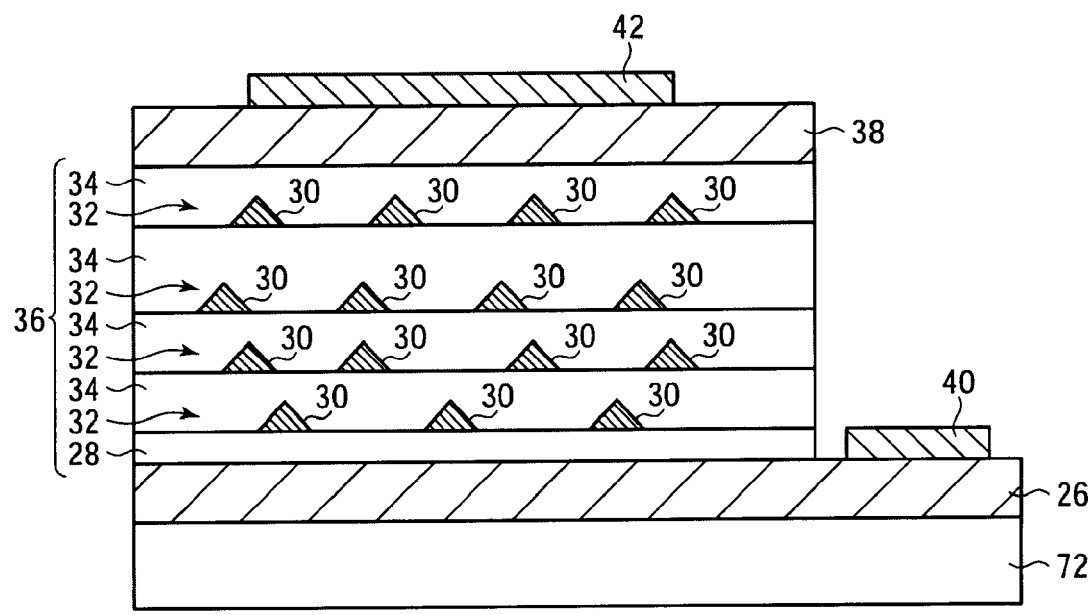

Hereafter, in the same way as in the method of manufacturing the photodetector according to the second embodiment illustrated in FIGS. 7B to 8B, the upper electrode 38 and the electrodes 40, 42 are formed, and the photodetector according to the present embodiment is completed (FIG. 13B).

As described above, it is possible that, as the base substrate for the quantum dots 30 to be formed on, the inclined substrate 72 is used, whereby the quantum dots 30 having dimensions different among directions may be grown.

A Sixth Embodiment

Figure 14:
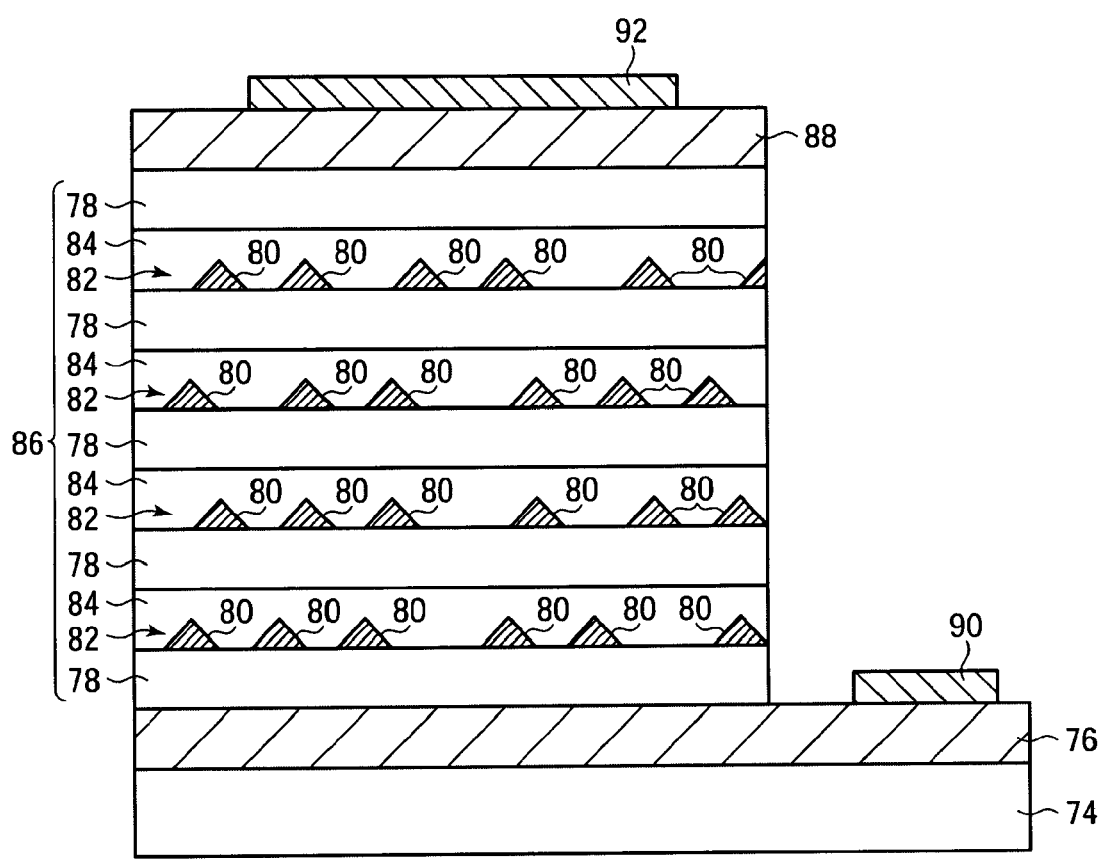
FIG. 14 is a sectional view illustrating the structure of the photoemission element according to a sixth embodiment.
Figure 15:
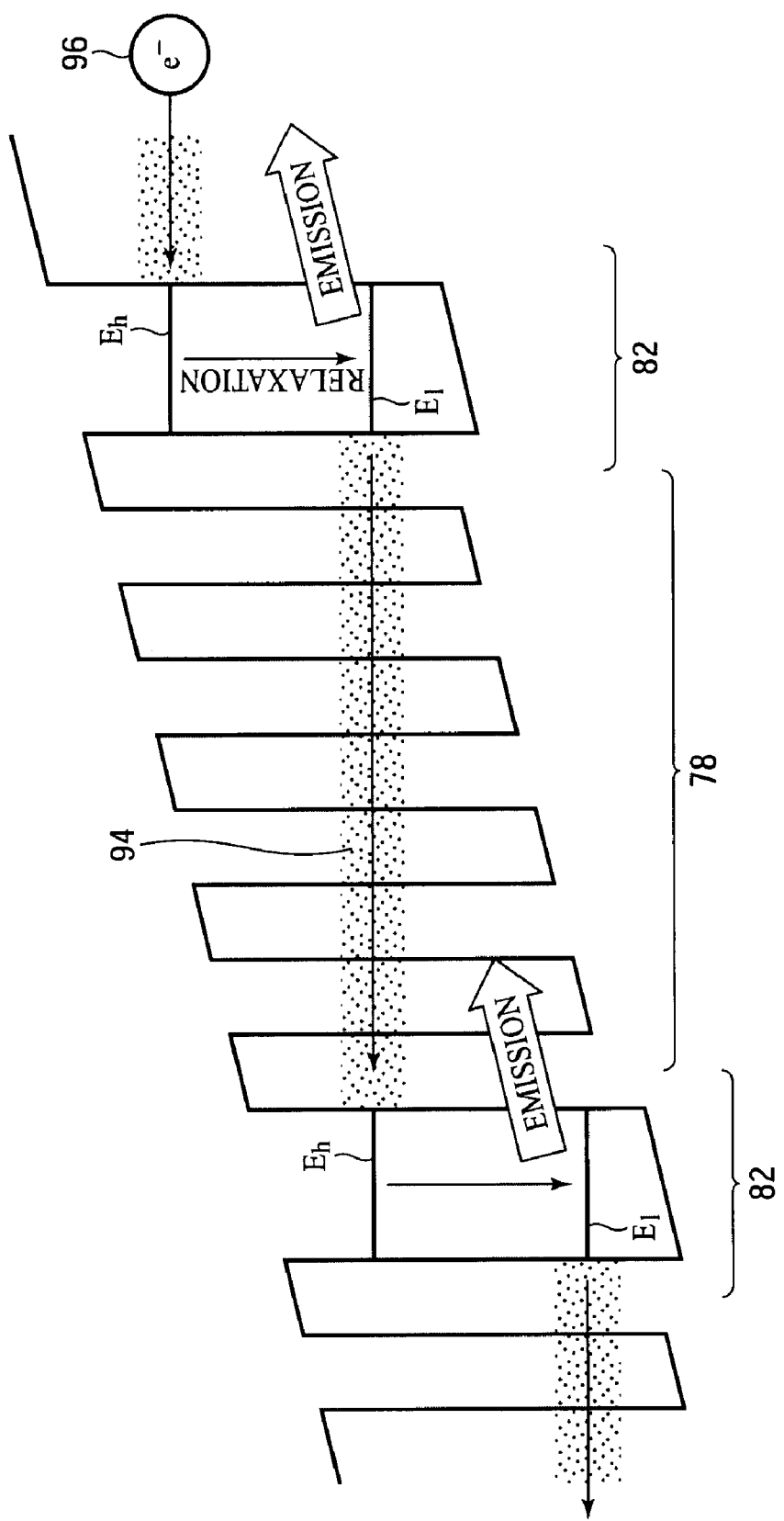
FIG. 15 is a view explaining the emission mechanism of the photoemission element according to the sixth embodiment.

The photoemission element according to a sixth embodiment will be explained with reference to FIGS. 14 to 18B. FIG. 14 is a sectional view illustrating the structure of the photoemission element according to the present embodiment. FIG. 15 is a view explaining the emission mechanism of the photoemission element according to the present embodiment. FIGS. 16A-18B are views illustrating the method of manufacturing the photoemission element according to the present embodiment.

In the second to the fifth embodiments, the photodetector which includes the infrared absorption layer 36 having the quantum dot layer 32 of quantum dots 30 having dimensions different among directions is described. However, the quantum dot layer of quantum dots having dimensions different among directions may be also applicable to the photoemission element. That is, the quantum dot layer of quantum dots having dimensions different among directions is stacked to form the photoemission layer of the photoemission element, whereby the photoemission element can emit light of multi-wavelengths having different polarization directions.

In the present embodiment, the photoemission element having the quantum dot layer of quantum dots having dimensions different among directions is explained.

First, the structure of the photoemission element according to the present embodiment will be explained with reference to FIG. 14.

As illustrated, over an inclined substrate 74, a lower electrode layer 76 of an n-type GaAs layer of, e.g. a 1000 nm-thickness is formed. As the inclined substrate 74, a semi-insulating GaAs substrate having the surface inclined toward (111) direction by 5° from (100) plane orientation is used.

Over the lower electrode layer 76, a multiple quantum well layer 78 having the multiple quantum well structure is formed. The multiple quantum well layer 78 is formed of a well layer of an i-type $In_{0.5}Ga_{0.5}As$ layer of, e.g., a 5 nm-thickness and a barrier layer of an i-type $Al_{0.3}Ga_{0.3}As$ layer of, e.g., a 5 nm-thickness stacked, e.g., 10 times.

Over the multiple quantum well layer 78, a quantum dot layer 82 of a plurality of quantum dots 80 of InAs is formed. Over the quantum dot layer 82, an intermediate layer 84 of an i-type $Al_{0.3}Ga_{0.3}As$ layer of, e.g., a 10 nm-thickness is formed, burying the quantum dots 80. Over the intermediate layer 84, the multiple quantum well layer 78, the quantum dot layer 82 and the intermediate layer 84 are stacked repeatedly, e.g., three times. Over the uppermost intermediate layer 84, the multiple quantum well layer 78 is formed.

Thus, over the lower electrode layer 76, a photoemission layer 86 including the layer structure of the multiple quantum well layer 78, the quantum dot layer 82 and the intermediate layer 84 stacked, e.g., four times, and the multiple quantum well layer 78 formed over the layer structure is formed.

The quantum dos 80 of the respective quantum dot layers 82 included in the photoemission layer 86 are grown over the inclined substrate 74 have configurational anisotropy and have dimensions different among directions. Specifically, the quantum dots 80 have dimensions different among directions in plane parallel to the substrate surface.

Over the uppermost multiple quantum well layer 78 of the photoemission layer 86, an upper electrode layer 88 of an n-type GaAs layer of, e.g., a 1000 nm-thickness is formed.

In a partial region of the lower electrode layer 76, the upper electrode layer 88 and the photoemission layer 86 are removed, and over the lower electrode layer 76 in this region, an electrode 90 of AuGe/Au layer is formed.

Over the upper electrode layer 88, an electrode 92 of an AuGe/Au layer is formed.

Thus, the photoemission element according to the present embodiment is constituted.

Next, the photoemission of the photoemission element according to the present embodiment will be explained with reference to FIG. 15.

In the photoemission element according to the present embodiment illustrated in FIG. 14, as illustrated in FIG. 15, a sub-band due to the quantum effect is formed in the multiple quantum well layer 78. Electric signals are inputted to the photoemission element according to the present embodiment, i.e., a voltage is applied between the electrodes 90, 92 to flow current to the photoemission layer 86, carriers (electrons) 96 traverse the multiple quantum well layer 78 mainly through the sub-band 94 to be supplied to the quantum dot layers 82.

In the multiple quantum well layer 78 and the quantum dot layer 82, the heights of the respective energy levels are set so that the carriers 96 can move from the sub-band 94 to the higher quantum level $E_h$ of the quantum dot layer 82. Resultantly, the carriers 96 flow into the higher quantum level $E_h$ of the quantum dot layer 82 from the sub-band 94. Then, the carriers 96 relax from the higher quantum level $E_h$ of the quantum dot layers 82 to the lower quantum level $E_1$, and accompanying this relaxation, light equivalent to an energy difference between the higher quantum level $E_h$ and the lower quantum level $E_1$ is emitted.

Furthermore, in the multiple quantum well layer 78 and the quantum dot layer 82, the heights of the respective energy levels are set so that the carriers 96 can move from the lower quantum level $E_1$ of the quantum dot layer 82 to the sub-band 94 of the multiple quantum well layer 78, which is on the side of the anode, i.e., downstream of the flow of the carriers 96. Thus, the carriers 96 go on flowing without staying in the quantum dot layer 82, sequentially through the respective quantum dot layers 82 stacked with the multiple quantum well layers 78 therebetween. Resultantly, emission is continuously made in the respective quantum dot layers 82.

The above-described energy levels may be set by adjusting the size of the quantum dots 80 and the thickness of the multiple quantum well layer 78, etc., or suitably selecting elements forming the quantum dots 30 and the multiple quantum well layers 78.

Thus, in the photoemission element according to the present embodiment, a voltage is applied between the electrodes 90, 92 to flow a current in the photoemission layer 86, whereby light is emitted due to the photoelectric conversion in the respective quantum dot layers 82 of the photoemission layer 86. The quantum dots 80 in the respective quantum dot layers 82 have dimensions different among directions. To this end, in the respective quantum dot layers 82, a plurality of excitation levels of different energy positions are formed corresponding to directions among which the dimensions of the quantum dots 80 are different. Thus, the light of multiwavelength of wavelengths having different polarization directions is emitted from the respective quantum dot layers 82 of the photoemission layer 86.

Here, because of the quantum dots 80 having dimensions different among directions specifically in the plane parallel with the substrate surface, the directions of advance of light of multiwavelength having the polarization direction different corresponding to wavelengths are vertical to the substrate surface. That is, quantum dots 80 have dimensions different among directions in the plane vertical to the direction of advance of light of multiwavelength to be emitted.

As described above, in the photoemission element according to the present embodiment, the quantum dots 80 of the respective quantum dot layers 82 forming the photoemission layer 86 have dimensions different among directions, whereby multiwavelength light of wavelengths having different polarization directions may be emitted. According to the present embodiment, without the necessity of a plurality of the photoemission layer, light of multiwavelength having wavelengths of different polarization directions may be emitted by the single photoemission layer 86, whereby a polarized light source which emits by the simple constitution light of multiwavelength of different polarization directions can be provided.

Next, the method of manufacturing the photoemission element according to the present embodiment will be explained with reference to FIGS. 16A to 18B.

Figure 16A:
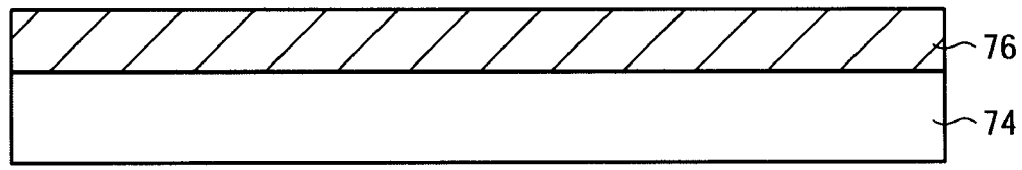
FIGS. 16A-16D, 17A-17B and 18A-18B are views illustrating the method of manufacturing the photoemission element according to the sixth embodiment.

First, over the inclined substrate 74, the lower electrode 76 of an n-type GaAs layer is grown at, e.g., 600° C. substrate temperature by, e.g., MBE method (FIG. 16A). As the inclined substrate 74, a semi-insulating GaAs substrate having the surface inclined toward (111) direction by 5° from (100) plane orientation is used. The film thickness of the lower electrode layer 76 is, e.g., 1000 nm. The lower electrode layer 76 is doped with an n-type impurity, e.g., Si and in e.g., a $2\times10^{18}$ cm$^{-3}$ concentration.

After the lower electrode layer 76 has been formed, the substrate temperature is lowered to, e.g., 450° C. which is suitable for the later growth of the quantum dots 80.

Figure 16B:
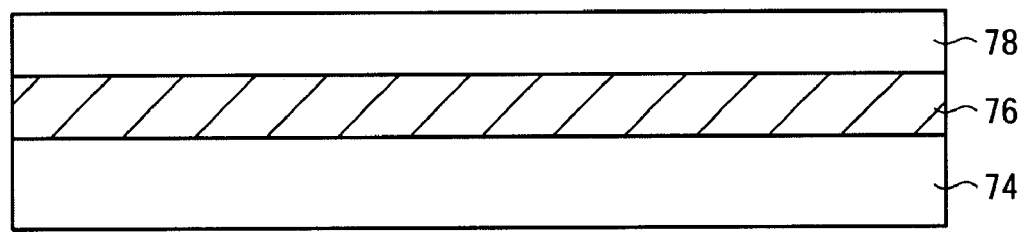

Then, over the lower electrode layer 76, the well layer of an i-type $In_{0.5}Ga_{0.5}As$ layer of, e.g. a 5 nm-thickness and the barrier layer of an i-type $Al_{0.3}Ga_{0.3}As$ layer of, e.g., a 5 nm-thickness are stacked repeatedly, e.g., ten times to form the multiple quantum well layer 78 (FIG. 16B).

Figure 16C:
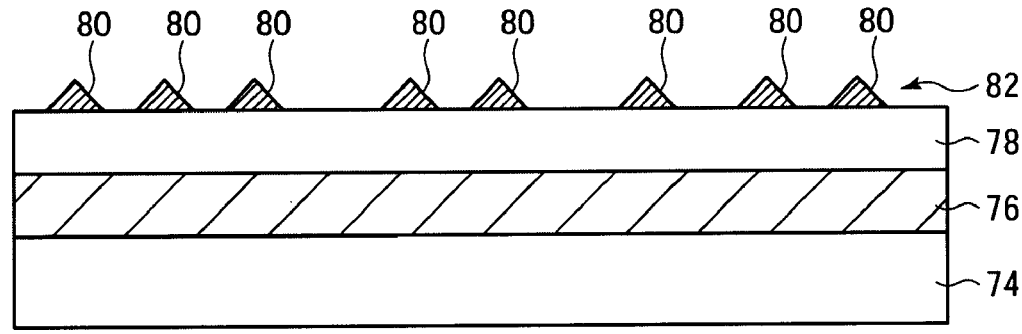

Then, over the multiple quantum well layer 78, a plurality of the quantum dots 82 of InAs are grown to form the quantum dot layer 82 (FIG. 16C). The quantum dots 80 of InAs are grown at, e.g., a 450° C. substrate temperature by Stranski-Krastanov crystal growth mode by feeding InAs of a total feed amount corresponding to 2 ML at, e.g., a 0.1 ML/s rate. In the present embodiment, the base substrate for the quantum dots 80 to be formed on, the inclined substrate 74 is used, whereby the quantum dots 80 having dimensions different among directions are grown. The quantum dots 80 may be grown by MBE method using $As_4$ molecular beams as the As source to thereby have dimensions different among directions.

Figure 16D:
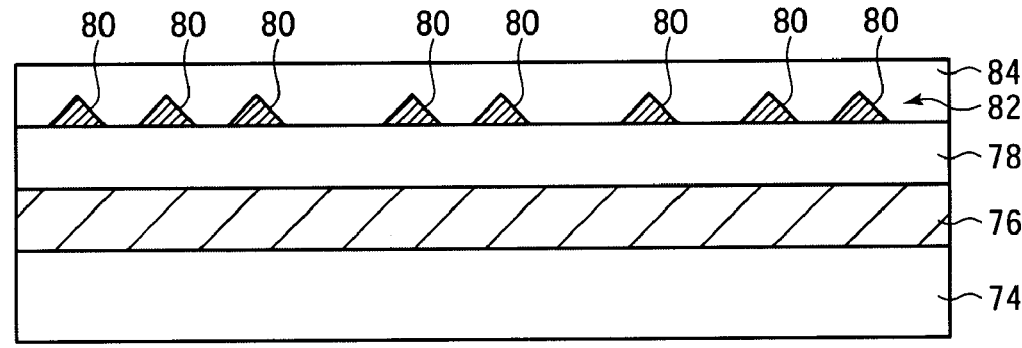

Then, over the quantum dot layer 82, the intermediate layer 84 of an i-type $Al_{0.3}Ga_{0.3}As$ layer is grown by, e.g., MBE method, burying the plural quantum dots 80 (FIG. 16D). The film thickness of the intermediate layer 84 is, e.g., 10 nm.

Figure 17A:
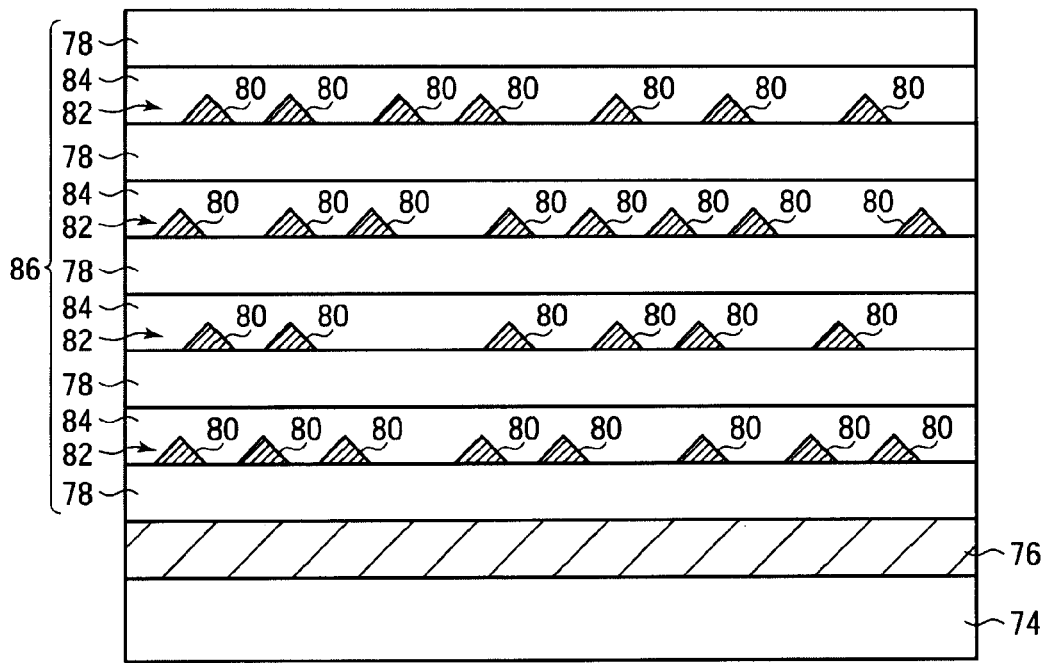

Then, over the intermediate layer 84, in the same way as above, the multiple quantum well layer 78, the quantum dot layer 82 and the intermediate layer 84 are repeatedly grown required times, e.g., three times. Furthermore, over the uppermost intermediate layer 84, in the same way as above, the multiple quantum well layer 78 is grown. Thus, over the lower electrode layer 76, the photoemission layer 86 including the layer structure of the multiple quantum well layer 78, the quantum dot layer 82 and the intermediate layer 84 stacked, e.g., four times, and the multiple quantum well layer 78 formed over the layer structure is formed (FIG. 17A).

After the photoemission layer 86 has been formed, the substrate temperature is raised to, e.g., 600° C. suitable for the later growth of the upper electrode layer 88.

Figure 17B:
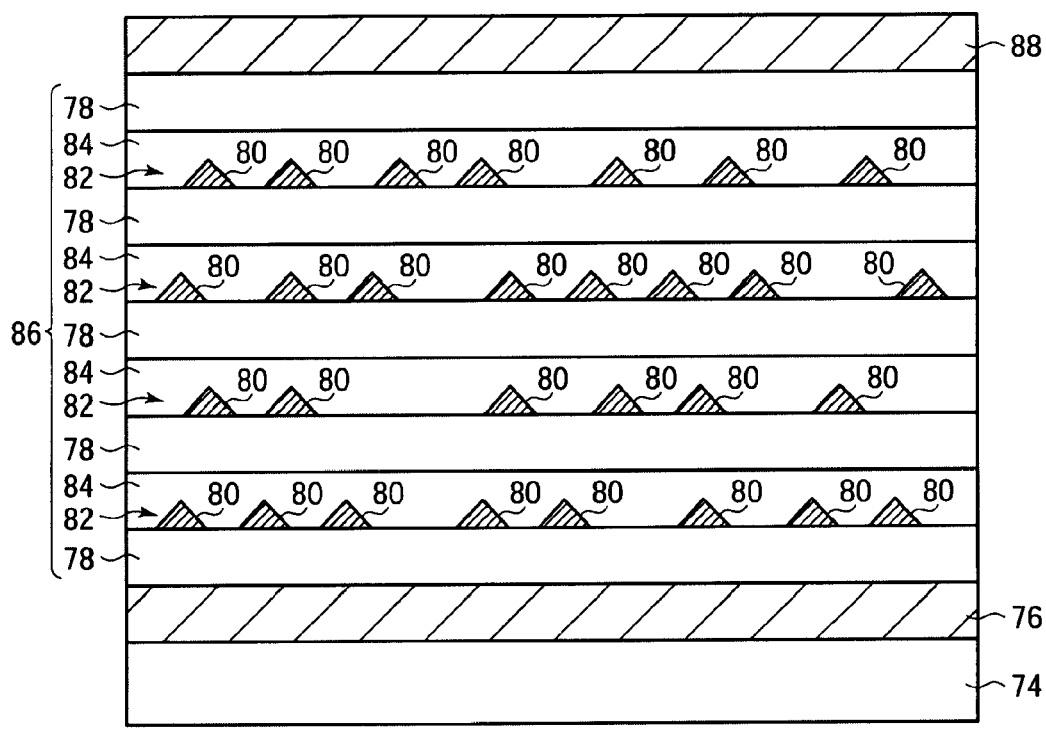

Next, over the photoemission layer 88, the upper electrode layer 88 of an n-type GaAs layer is grown at, e.g., a 600° C. substrate temperature by, e.g., MBE method (FIG. 17B). The film thickness of the upper electrode layer 88 is, e.g., 1000 nm. The upper electrode layer 88 is doped with an n-type impurity, e.g., Si in, e.g., a $2\times10^{18}$ cm$^{-3}$ concentration.

Figure 18A:
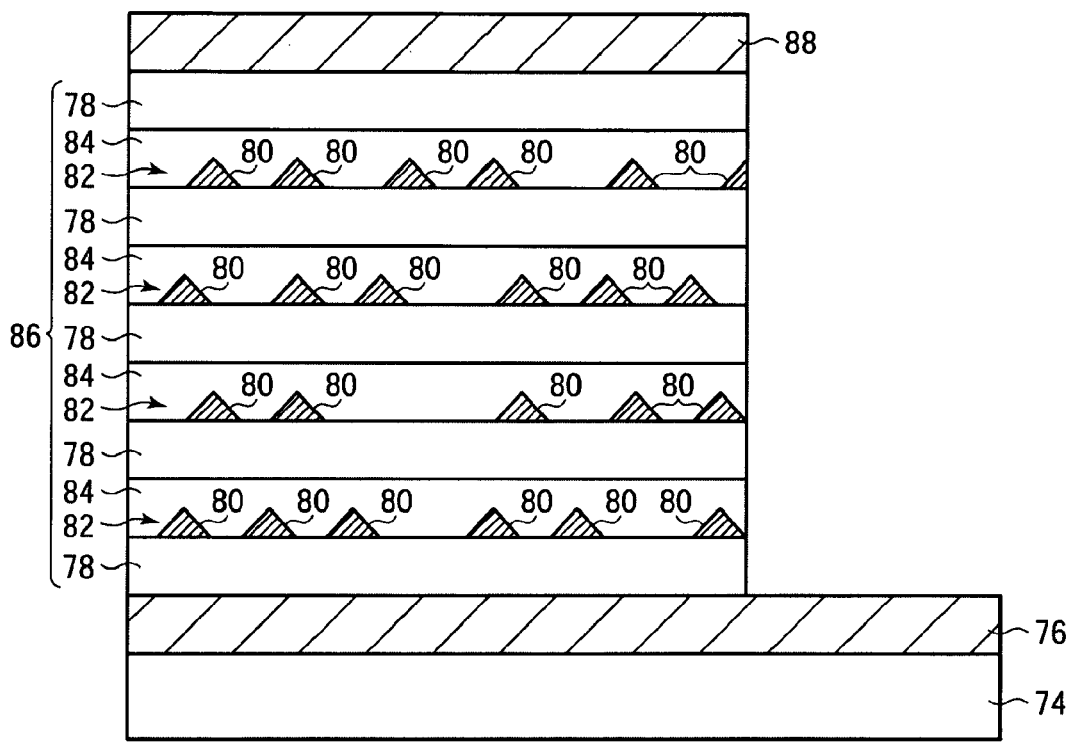

Next, by photolithography and dry etching, the upper electrode layer 88 and the photoemission layer 86 in the lower electrode forming region are removed to expose the surface of the lower electrode layer 76 (FIG. 18A).

Figure 18B:
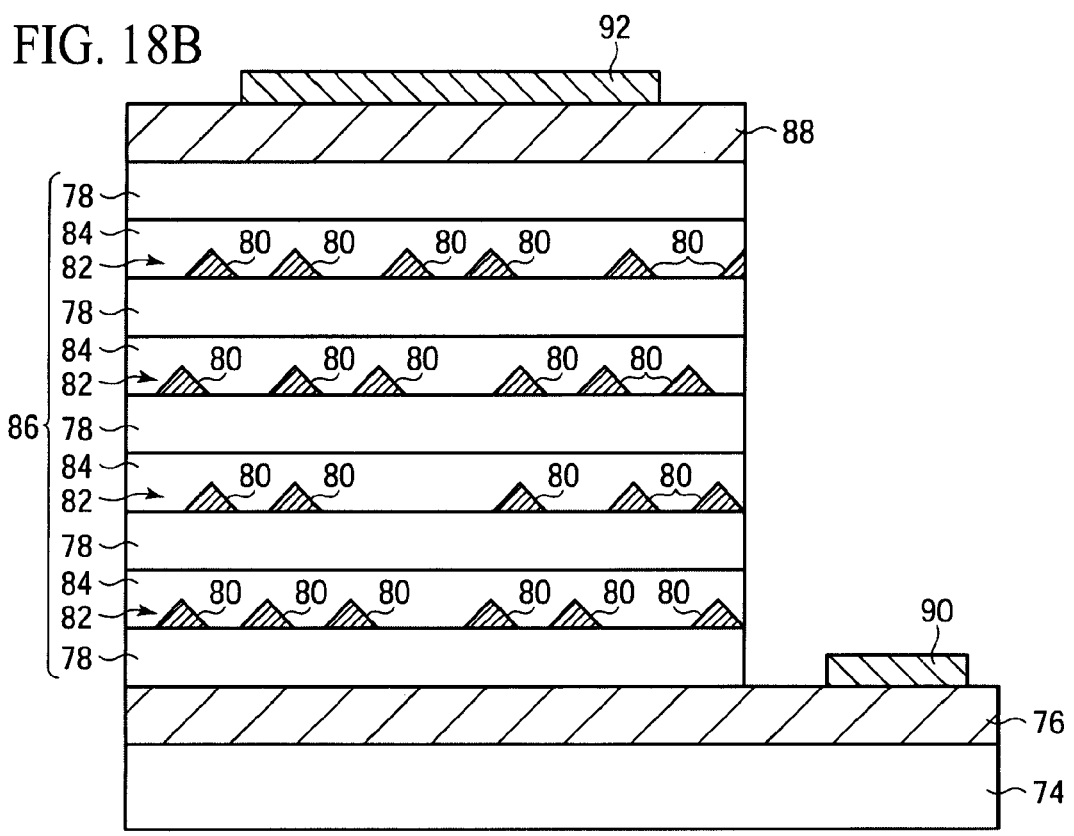

Next, the electrodes 90, 92 formed of an AuGe/Au layer are formed respectively over the exposed lower electrode layer 76 and the exposed upper electrode layer 88 by, e.g., metal evaporation, and the photoemission element according to the present embodiment is completed (FIG. 18B).

Thus, according to the present embodiment, the photoemission layer 86 is formed of the stacked quantum dot layers 82 having dimensions different among directions, whereby light of multiwavelength having wavelengths of different polarization directions may be emitted. Thus, according to the present embodiment, a polarized light source which has the simple constitution and can emit light of multiwavelength of different polarization directions may be provided.

Modified Embodiments

The above-described embodiments may cover other various modifications.

For example, in the above-described embodiments, the quantum dots 30, 80 of dimensions different among directions are grown by MBE method using $As_4$ molecular beams as the As source and by using the inclined substrates 72, 74 as the base substrates for growing the quantum dots. However, the methods of growing quantum dots of dimensions different among directions are not limited to them. For example, the quantum dots of dimensions different among directions may be grown by using the plane orientation dependency of the growth rate of the quantum dots, or suitably selecting the quantum dot material and the base materials so that the crystal lattice constant difference between the quantum dot material and the base material the quantum dots grow on differs among directions.

In the above-described embodiments, the quantum dots 30, 80 are grown by MBE method, but the quantum dots may be grown by other crystal growing methods, e.g., metal organic chemical vapor deposition, etc.

In the above-described embodiments, the quantum dots 30, 80 are grown by Stranski-Krastanov crystal growth mode. However, the method of forming the quantum dots is not limited to this crystal growth mode. As the method of forming the quantum dots, any other method which can form quantum dots having dimensions different among directions may be used.

In the above-described embodiments, four layers of the quantum dot layer 32, 84 are stacked. However, the layer number of the quantum dot layer is not limited to four layers. The quantum dot layer may be a single layer, or required numbers of the quantum dot layer may be stacked.

In the above-described embodiments, the infrared absorption layer 36 is the combination of the quantum dots 30 of InGaAs and the intermediate layer 34 of GaAs, and the photoemission layer 86 is the combination of the quantum dots 80 of InAs and the intermediate layer 84 of AlGaAs. The combination of the material of the quantum dots and the material of the intermediate layer is not limited to the combination described in the embodiments, and the combinations of various materials may be used.

In the above-described embodiments, infrared radiation from an infrared radiation source is incident vertically on the substrate surface. However, the incident direction of the infrared radiation is not limited to this. In the photodetector according to the above-described embodiments, the quantum dots may have the dimensions different in plane vertical to the direction of advance of the infrared radiation.

In the above-described embodiments, the infrared radiation is polarized to the linearly polarized infrared radiation while having the polarization direction controlled by the polarizer 46 having the direction controlled, the combination of the polarizer 54 and the liquid crystal filter 56, or the combination of the polarization beam splitter 62 and the shutters 66a, 66b. However, the constitution for controlling the polarization direction is not limited to them.

In the above-described embodiments, the infrared photodetectors, in which the infrared radiation to be incident on the photodetector 22 has the polarization direction controlled, whereby infrared radiation intensities of discrete wavelengths are independently measured, are described. However, an infrared photodetector which extracts infrared radiation of a specific polarization direction out of infrared radiation from an infrared radiation source may be also constituted. In this case, for the infrared radiation having a wide spectrum emitted by an object, the infrared absorption layer of the above-described embodiments, which is sensitive to infrared radiation of different wavelengths corresponding to the polarization directions, is used to measure the intensity of the infrared radiation of a specific sensible wavelength. Thus, the infrared radiation of the polarization direction corresponding to the wavelength the infrared radiation intensity has been measured may be extracted from the infrared radiation emitted from the object.

In the above-described embodiments, the infrared photodetector which detects infrared radiation of multiwavelength is constituted. However, the application range of the above-described embodiments is not limited to the detection of infrared radiation and is applicable to the detection of multi-wavelength in any wavelength range.

In the above-described embodiments, the photoemission layer 86 is formed of quantum dots 80 having dimensions different among direction in the plane parallel with the substrate surface. However, the quantum dots may have dimensions different among directions in a prescribed plane other than the plane parallel to the substrate surface. In the photoemission element of the above-described embodiment, the quantum dots forming the photoemission layer have dimensions different among direction in the plane vertical to the direction of advance of multiwavelength light whose polarization directions are different corresponding to a wavelength to be emitted.

In the above-described embodiments, by using the quantum dots having dimensions different among directions, the photoabsorption layer 36 which generates electric signals by photoelectric converting light of wavelengths different corresponding to polarization directions of the incident light is constituted. However, such photoabsorption layer may not essentially include the quantum dots.

In the above-described embodiment, by using the quantum dots having dimensions different among directions, the photoemission layer 86 which generates light of multiwavelength having wavelengths different corresponding to polarization directions by photoelectric converting the electric signals is constituted. However, such photoemission layer may not essentially include the quantum dots.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. An optical semiconductor device comprising:
a polarization unit configured to control a polarization direction of an incident light to be measured;
an active part, which includes a quantum dot having dimensions that differ from one another among directions,
said active part to which the incident light, in which the polarization direction of the incident light is controlled, is applied, and said active part generates an electric signal by photoelectrically converting a light having a wavelength which differs corresponding to the polarization direction of the incident light;
a read unit configured to read the electric signal generated by the active unit; and
a control unit configured to read the electric signal by the read unit in synchronization with a control of the polarization direction by the polarization unit and detect respective intensities at plural wavelength bands of the incident light corresponding to the polarization direction of the incident light,
wherein the polarization unit includes a polarizer which converts the incident light to a linearly polarized light, and a liquid crystal filter which changes a polarization direction of the linearly polarized light.

2. The optical semiconductor device according to claim 1, wherein
the polarization unit controls a direction of the polarizer to thereby control the polarization direction of the linearly polarized light.

3. The optical semiconductor device according to claim 1, wherein
the polarization unit includes a polarized light split unit which splits the incident light into a first linearly polarized component and a second linearly polarized component crossing each other, and a shutter unit which apply selectively one of the first linearly polarized component and the second linearly polarized component to the active unit.

4. The optical semiconductor device according to claim 1, wherein
the incident light is an infrared radiation.

5. The optical semiconductor device according to claim 1, wherein
the quantum dot includes arsenic as a constituent material, and is grown by a molecular beam epitaxy using an $As_4$ molecular beam as an arsenic source.

6. The optical semiconductor device according to claim 1, wherein
the quantum dot is grown over an inclined substrate.

7. The optical semiconductor device according to claim 1, wherein
the quantum dot is formed of InGaAs or InAs.

8. The optical semiconductor device according to claim 1, wherein
the active unit is formed of a plurality of quantum dots stacked with intermediate layers formed therebetween.

9. An optical semiconductor device comprising:
a polarization unit configured to control a polarization direction of an incident light to be measured;
an active part, which includes a quantum dot having dimensions that differ from one another among directions,
said active part to which the incident light, in which the polarization direction of the incident light is controlled, is applied, and said active part generates an electric signal by photoelectrically converting a light having a wavelength which differs corresponding to the polarization direction of the incident light;
a read unit configured to read the electric signal generated by the active unit; and
a control unit configured to read the electric signal by the read unit in synchronization with a control of the polarization direction by the polarization unit and detect respective intensities at plural wavelength bands of the incident light corresponding to the polarization direction of the incident light,
wherein the polarization unit includes a polarized light split unit which splits the incident light into a first linearly polarized component and a second linearly polarized component crossing each other, and a shutter unit which apply selectively one of the first linearly polarized component and the second linearly polarized component to the active unit.

10. The optical semiconductor device according to claim 9, wherein
the polarization unit includes a polarizer which converts the incident light to a linearly polarized light and controls a direction of the polarizer to thereby control a polarization direction of the linearly polarized light.

11. The optical semiconductor device according to claim 9, wherein
the polarization unit includes a polarizer which converts the incident light to a linearly polarized light, and a liquid crystal filter which changes a polarization direction of the linearly polarized light.

12. The optical semiconductor device according to claim 9, wherein
the incident light is an infrared radiation.

13. The optical semiconductor device according to claim 9, wherein
the quantum dot includes arsenic as a constituent material, and is grown by a molecular beam epitaxy using an $As_4$ molecular beam as an arsenic source.

14. The optical semiconductor device according to claim 9, wherein
the quantum dot is grown over an inclined substrate.

15. The optical semiconductor device according to claim 9, wherein
the quantum dot is formed of InGaAs or InAs.

16. The optical semiconductor device according to claim 9, wherein
the active unit is formed of a plurality of quantum dots stacked with intermediate layers formed therebetween.

* * * * *